United States Patent
Joshi

(10) Patent No.: US 10,948,241 B2
(45) Date of Patent: Mar. 16, 2021

(54) VAPOR CHAMBER HEAT SPREADERS HAVING IMPROVED TRANSIENT THERMAL RESPONSE AND METHODS OF MAKING THE SAME

(71) Applicant: Toyota Motor Engineering & Manufacturing North America, Inc., Plano, TX (US)

(72) Inventor: Shailesh N. Joshi, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/170,974

(22) Filed: Oct. 25, 2018

(65) Prior Publication Data
US 2020/0132392 A1     Apr. 30, 2020

(51) Int. Cl.
| | | |
|---|---|---|
| *F28D 15/04* | (2006.01) | |
| *H05K 7/20* | (2006.01) | |
| *F28D 21/00* | (2006.01) | |

(52) U.S. Cl.
CPC ......... *F28D 15/046* (2013.01); *H05K 7/2039* (2013.01); *H05K 7/20309* (2013.01);
(Continued)

(58) Field of Classification Search
CPC ............... H05K 1/0203; H05K 7/2029; H05K 7/20309–7/20318; H05K 7/20336;
(Continued)

(56) References Cited

U.S. PATENT DOCUMENTS

| | | | |
|---|---|---|---|
| 1,864,941 A * | 6/1932 | Riemann | 106/222 |
| 6,116,330 A * | 9/2000 | Salyer | F28D 20/023 |
| | | | 165/10 |

(Continued)

FOREIGN PATENT DOCUMENTS

CN     105845649 A     8/2016

OTHER PUBLICATIONS

Dume Belle, Jun. 2017, Heat Conductioin goes Ballistic in Opals, Nonotechweb.org (Year: 2017).*

(Continued)

*Primary Examiner* — Zachary Pape
*Assistant Examiner* — Amir A Jalili
(74) *Attorney, Agent, or Firm* — Dinsmore & Shohl

(57) ABSTRACT

A vapor chamber heat spreader includes an evaporator plate, a condenser plate, and a plurality of sidewalls extending from the evaporator plate to the condenser plate to define a vapor chamber. An evaporator wick is coupled to an evaporating surface of the evaporator plate and a thermal compensation layer is coupled to an inner surface of the sidewalls. The thermal compensation layer comprising a plurality of core-shell phase change particles embedded in a metal. The core-shell PC particles include a core that includes a PCM having a phase change temperature of from 50° C. to 250° C. and a shell encapsulating the core. A heat transfer fluid is disposed within the vapor chamber. The vapor chamber heat spreader exhibits superior transient thermal response compared to commercially available heat spreaders. A power electronics assembly includes an electronics device coupled to a surface of the vapor chamber heat spreader.

20 Claims, 14 Drawing Sheets

(52) U.S. Cl.
CPC ..... H05K 7/20318 (2013.01); H05K 7/20336 (2013.01); F28D 2021/0028 (2013.01)

(58) Field of Classification Search
CPC ..... H05K 7/2039; F28D 15/02; F28D 15/046; F28D 2021/0028; F28F 13/003; H01L 23/427; H01L 23/3736; H01L 23/4275; H01L 23/42; C09K 5/02; C09K 5/063
USPC ....... 361/700, 708, 718–719; 165/80.4–80.5, 165/104.21, 104.33; 257/715
See application file for complete search history.

(56) References Cited

U.S. PATENT DOCUMENTS

| | | | |
|---|---|---|---|
| 6,889,755 B2 | 5/2005 | Zuo et al. | |
| 9,909,814 B2 | 3/2018 | Yang et al. | |
| 9,909,816 B2 | 3/2018 | Thiagarajan et al. | |
| 9,918,407 B2* | 3/2018 | Rosales | H01L 23/3735 |
| 9,970,714 B2 | 5/2018 | Zhou | |
| 10,347,601 B1* | 7/2019 | Dede | H01L 24/83 |
| 10,403,594 B2* | 9/2019 | Joshi | H01L 24/32 |
| 10,515,871 B1* | 12/2019 | Joshi | F28F 1/40 |
| 2004/0159422 A1* | 8/2004 | Zuo | F28D 15/046 |
| | | | 165/104.14 |
| 2007/0022603 A1* | 2/2007 | Chuang | B23P 15/26 |
| | | | 29/890.032 |
| 2010/0264353 A1* | 10/2010 | Hartmann | C08B 15/02 |
| | | | 252/62 |
| 2011/0017431 A1* | 1/2011 | Yang | F28D 15/0233 |
| | | | 165/104.26 |
| 2013/0271913 A1* | 10/2013 | MacDonald | F28D 15/00 |
| | | | 361/679.52 |
| 2014/0002998 A1* | 1/2014 | Pidwerbecki | H05K 7/2039 |
| | | | 361/717 |
| 2015/0090428 A1* | 4/2015 | Chauhan | F28D 15/046 |
| | | | 165/104.26 |
| 2016/0091258 A1* | 3/2016 | Ahamed | F28D 15/0233 |
| | | | 165/104.26 |
| 2017/0311478 A1* | 10/2017 | Engelhardt | H01L 23/4275 |
| 2018/0015385 A1* | 1/2018 | Meinhart | H05B 3/26 |
| 2018/0073814 A1* | 3/2018 | Zhou | F28D 15/04 |
| 2018/0090415 A1* | 3/2018 | Escobar-Vargas | H01L 23/427 |
| 2018/0320984 A1* | 11/2018 | Lewis | F28D 15/0283 |
| 2018/0356156 A1* | 12/2018 | Hurbi | F28C 3/08 |
| 2019/0229083 A1* | 7/2019 | Joshi | C09J 7/10 |
| 2019/0237388 A1* | 8/2019 | Dede | H01L 23/22 |
| 2019/0249929 A1* | 8/2019 | Rush | H01L 23/427 |
| 2019/0390919 A1* | 12/2019 | Lewis | F28D 15/046 |
| 2020/0100396 A1* | 3/2020 | Iyengar | G06F 1/20 |

OTHER PUBLICATIONS

Goodson, Metal Inverse Opals Could Better Cool Electronics, Apr. 18, 2016, Electronics Cooling, retrieved from https://www.electronics-cooling.com/2016/04/metal-inverse-opals-could-better-cool-electronics/ (Year: 2016).*

Vitorino, et al., "Highly Conducting Core-Shell Phase Change Materials for Thermal Regulation", Science Direct, Applied thermal Engineering, May 2014, pp. 131-139, vol. 66, Issues 1-2.

Dumé, "Heat Conduction Goes Ballistic in Opals", Nano Tech Web, Technology Update, 2016.

* cited by examiner

VAPOR CHAMBER HEAT SPREADERS HAVING IMPROVED TRANSIENT THERMAL RESPONSE AND METHODS OF MAKING THE SAME

TECHNICAL FIELD

The present specification generally relates to vapor chamber heat spreaders for power electronics assemblies, and more particularly, to vapor chamber heat spreaders incorporating wicking structures and thermal compensation layers with high heat capacity.

BACKGROUND

Power electronics devices are often utilized in high-power electrical applications, such as inverter systems for hybrid electric vehicles and electric vehicles. Such power electronics devices include electronic devices such as power semiconductor devices (e.g., power IGBTs, power transistors, and other electronic devices). With advances in battery technology and increases in electronics device packaging density, operating temperatures of power electronics devices have increased and are currently beyond 200° C. The increased heat generated from the electronic devices of the power electronics devices must be removed to prevent thermal-related damage to the electronic devices.

Heat spreading technology has been employed to uniformly spread heat on the surface of a heat sink. A heat spreader may be coupled to a heat generating device, such as the electronics devices of the aforementioned power electronics devices, to remove heat and lower the maximum operating temperature of the heat generating device. Solid metal heat spreaders comprising a solid mass of a thermally conductive metal have been used as heat spreading devices in power electronics devices to conduct heat from the electronics devices to a heat sink. Additionally, vapor chamber heat spreaders have also been used to transfer heat from the electronics devices to a heat sink. For vapor chamber heat spreaders, the heat is spread by a two-phase or boiling phenomenon used to provide an isothermal surface.

SUMMARY

Solid metal heat spreaders provide good transient thermal response to changes in heat flux, but the steady state operating temperature of solid metal heat spreaders is limited. Conventional vapor chamber heat spreaders can provide lower steady state operating temperatures, but the transient thermal response of vapor chamber heat spreaders to changes in heat flux is poor. Thus, there is an ongoing need for improved vapor chamber heat spreaders having superior transient thermal response to changes in heat flux.

In one or more aspects of the present disclosure, a vapor chamber heat spreader includes an evaporator plate, a condenser plate spaced apart from the evaporator plate, and a plurality of sidewalls extending from the evaporator plate to the condenser plate to define at least one vapor chamber. The vapor chamber heat spreader further includes a thermal compensation layer coupled to an inner surface of one or more of the plurality of sidewalls. The thermal compensation layer includes a sidewall wick and a plurality of core-shell phase change (PC) particles at least partially embedded in the sidewall wick. The sidewall wick may include a porous metal. The core-shell PC particles include a core comprising a phase change material (PCM) that may have a PC temperature within an operating temperature range of the vapor chamber heat spreader and a shell encapsulating the core. The shell may include a material having a melt temperature greater than the PC temperature of the PCM.

In yet another aspect of the present disclosure, a method of making a vapor chamber heat spreader may include forming a thermal compensation layer on an inner surface of one or more of a plurality of sidewalls, the thermal compensation layer including a sidewall wick and a plurality of core-shell phase change (PC) particles at least partially embedded in the sidewall wick. The sidewall wick may be a porous metal. The core-shell PC particles include a core that includes a phase change material (PCM) that may have a PC temperature within an operating temperature range of the vapor chamber heat spreader. The core-shell PC particles further include a shell encapsulating the core. The shell may include a shell material having a melt temperature greater than the PC temperature of the PCM. The method may further include coupling the evaporator plate and a condenser plate to the plurality of sidewalls to form the vapor chamber heat spreader having a vapor chamber defined by the evaporating surface of the evaporator plate, the inner surfaces of the plurality of sidewalls, and a condensing surface of the condenser plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
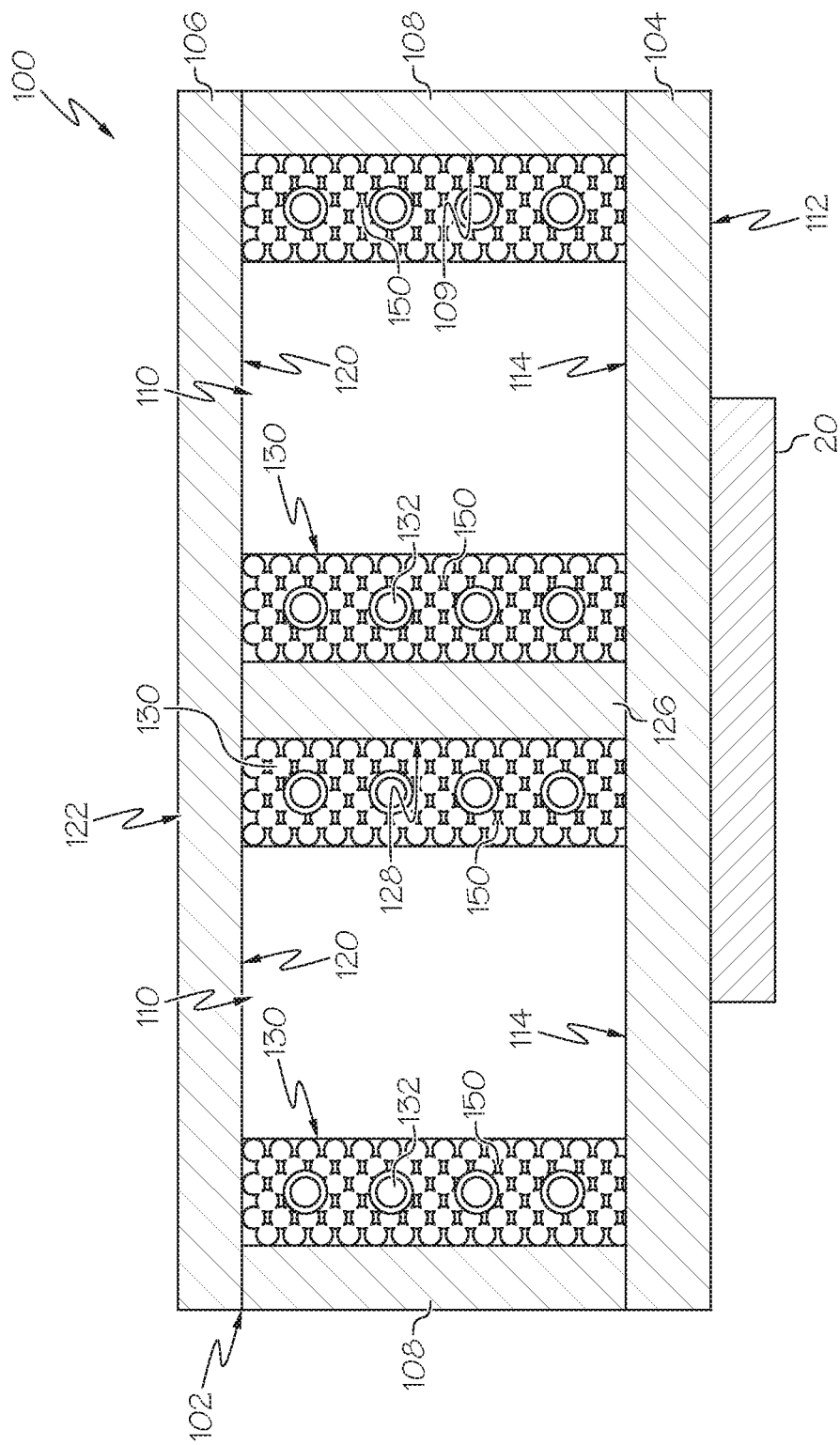
FIG. 1 schematically depicts a vapor chamber heat spreader having a thermal compensation layer on surfaces of sidewalls and fins of the vapor chamber heat spreader, the thermal compensation layer comprising a plurality of core-shell PC particles embedded in a sidewall wick structure, according to one or more embodiments shown and described herein.

The present disclosure is directed to vapor chamber heat spreaders that include a thermal compensation layer, the thermal compensation layer being operable to remove heat from the vapor chamber heat spreader to improve the transient thermal response of the vapor chamber heat spreader. Referring to FIG. 1, an example embodiment of the vapor chamber heat spreader 102 of the present disclosure is schematically depicted in a cross-sectional view. The vapor chamber heat spreader 102 of FIG. 1 may be coupled to a heat source, such as an electronic device 20 or a power electronics assembly 10 (FIG. 2) that generates heat, to form a heat spreader assembly 100. The vapor chamber heat spreader 102 includes an evaporator plate 104, a condenser plate 106, and one or more sidewalls 108 extending from the evaporator plate 104 to the condenser plate 106. The evaporator plate 104, condenser plate 106, and sidewalls 108 define a vapor chamber 110 within the vapor chamber heat spreader 102. The vapor chamber heat spreader 102 includes a thermal compensation layer 130 coupled to an inner surface 109 of at least one of the sidewalls 108. The thermal compensation layer 130 includes a plurality of core-shell phase change (PC) particles 132 embedded in a sidewall wick, which may be a metal inverse opal (MIO) layer. The core-shell PC particles 132 include a core comprising a phase change material (PCM) and a shell. The core-shell PC particles 132 may increase the heat capacity of the vapor chamber heat spreader 102, which may enable the vapor chamber heat spreader 102 to absorb more heat from the heat source (e.g., electronic device 20) during operation. Increasing the heat capacity of the vapor chamber heat spreader 102 and the surface area at the evaporator plate 104 may improve the transient and steady state thermal performance of the vapor chamber heat spreader 102. Various embodiments of the vapor chamber heat spreader 102 and power electronics assemblies incorporating the vapor chamber heat spreader 102 will be described in more detail herein.

Figure 2:
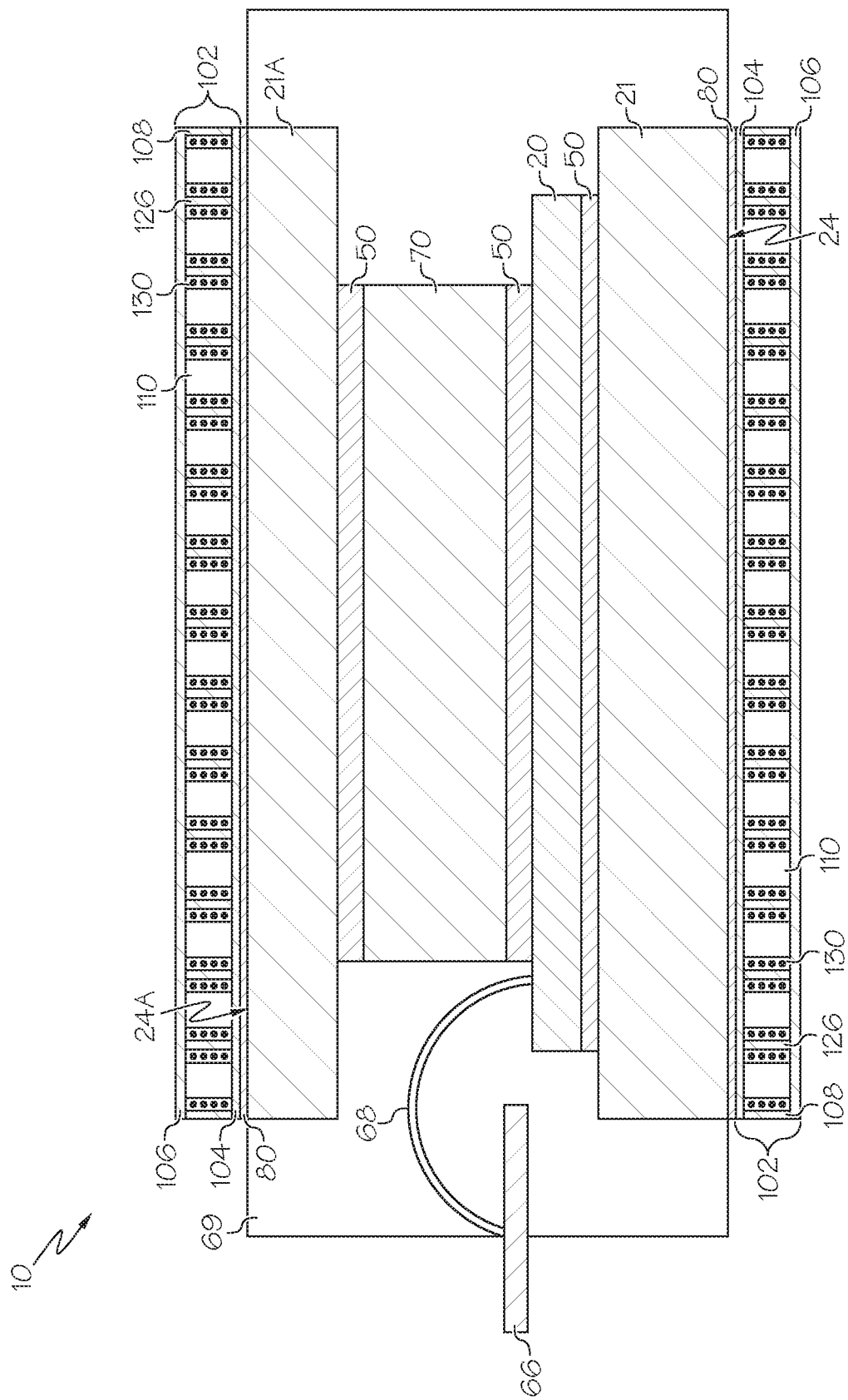
FIG. 2 schematically depicts a side cross-sectional view of a power electronics assembly including the vapor chamber heat spreader of FIG. 1, according to one or more embodiments shown and described herein.

Referring now to FIG. 2, a power electronics assembly 10 having double-sided cooling of the electronics device 20 is depicted. In some embodiments, the power electronics assembly 10 may include at least one electronics device 20 positioned within a stack of thermally coupled components. The electronic devices 20 may form one or more layers positioned between one or more additional layers that include substrates, bond layers, spacer layers, and/or the like. For example, in FIG. 1, the electronic device 20 may be bonded to a substrate 21 by a bonding layer 50 at one surface of the electronic device 20. The other side of the electronic device 20 may be bonded to a spacer layer 70 by another bonding layer 50. The spacer layer 70 may include a spacer material that is capable of electric and thermal conduction, such as but not limited to copper, aluminum, nickel, gallium, or any other metal, alloy, or compound that is capable of electrical and/or thermal conduction. The spacer layer 70 may be further bonded to a supplemental substrate 21A by still another bonding layer 50.

The substrate 21 and the supplemental substrate 21A may be a thermally conductive metal, a semiconductor material, an electrode, or the like. In some embodiments, the substrate 21 and/or the supplemental substrate 21A may be a directly bonded copper (DBC) substrate that includes a ceramic isolator with copper layers bonded to the surfaces of the ceramic isolator. In some embodiments, the substrate 21 may be a collector terminal of the power electronics assembly 10 and the supplemental substrate 21A may be an emitter terminal of the power electronics assembly 10. The power electronics assembly 10 may also include a gate electrode 66 electrically coupled to the electronic device 20. The gate electrode 66 may be directly electrically coupled to the electronic device 20 or electrically coupled to the electronic device 20 via a wire 68. In some embodiments, a signal such as a gate voltage may be applied to the gate electrode 66 to cause the electronic device 20 to conduct such that the substrate 21 and the supplemental substrate 21A may be electrically coupled. The power electronics assembly 10 may include a resin 69 configured to provide a supporting structure or package to the components of the power electronics assembly 10.

Still referring to FIG. 2, the vapor chamber heat spreader 102 of the present disclosure may be coupled to the substrate 21 and/or supplemental substrate 21A to provide heat removal from the substrate 21 and/or supplemental substrate 21A. In some embodiments, the evaporator plate 104 of the vapor chamber heat spreader 102 may be coupled to the cooling surface 24 of substrate 21 and/or cooling surface 24A of supplemental substrate 21A by a thermally-conductive and electrically-insulating bonding agent 80, such as thermal grease or other non-electrically conductive substance. In some embodiments, the condenser plates 106 of the vapor chamber heat spreaders 102 may be coupled to one or more coolers (not shown). The cooler, while not depicted, may include a heat sink; a liquid phase cooling apparatus, either active (e.g., utilizing jet channels and pumps), passive (e.g., utilizing thermal convection, conduction, radiation, including processes such as nucleation or the like), or a combination of both; or any other cooler device capable of removing heat from the power electronics assembly 10. The coolers may be coupled to the condenser plates 106 of the vapor chamber heat spreaders 102 using thermal grease or other thermally conductive and/or electrically insulating bonding material. FIG. 1 depicts only one possible embodiment of a power electronics assembly 10 and should not be limited to such components, arrangement, and configuration. For example, in some embodiments, the power electronics assembly 10 may include single-sided cooling only.

Figure 3:
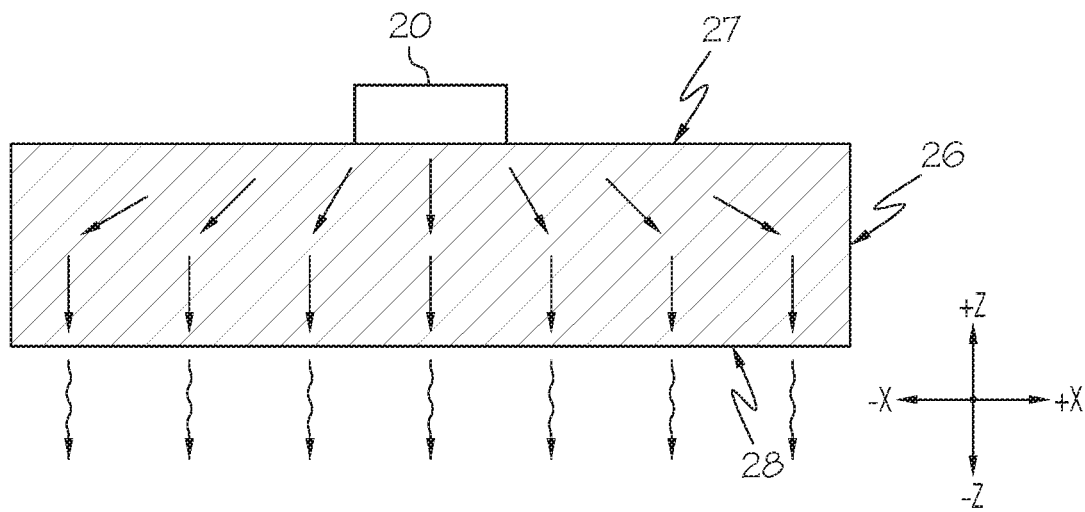
FIG. 3 schematically depicts a solid metal heat spreader of the prior art.

Referring now to FIG. 3, a solid metal heat spreader 26 of the prior art is depicted. The solid metal heat spreader 26 includes a solid mass of thermally conductive metal such as copper. The electronic device 20 or other heat source may be coupled to a top surface 27 of the solid metal heat spreader 26. During operation of the solid metal heat spreader 26, heat from the electronic device 20 or other heat source is conducted into and through the solid metal heat spreader 26 to a cooling surface 28, where the heat is removed to a heat sink. In the solid metal heat spreader 26, the removal of heat from the electronic device 20 or other heat source is by conduction through the solid metal heat spreader 26.

Figure 4:
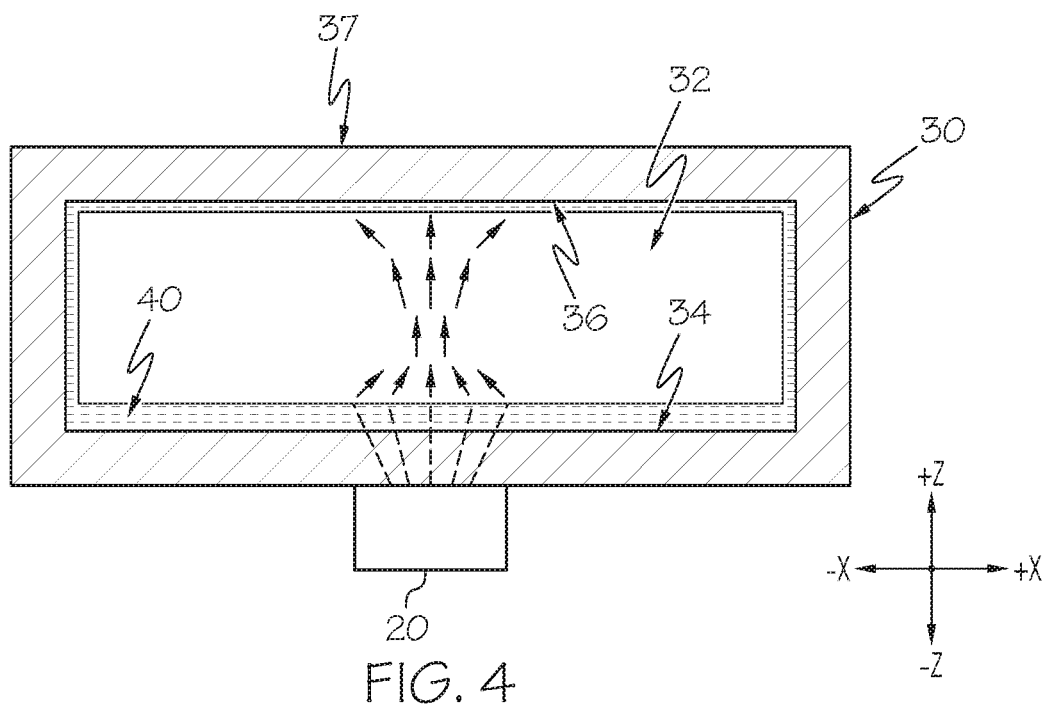
FIG. 4 schematically depicts a conventional vapor chamber heat spreader of the prior art.

Referring to FIG. 4, a conventional vapor chamber heat spreader 30 of the prior art is schematically depicted. The conventional vapor chamber heat spreader 30 includes a vapor chamber 32 having an evaporator side 34, a condenser side 36 spaced apart from the evaporator side 34, and a heat transfer fluid 40 disposed within the vapor chamber 32. During operation of the conventional vapor chamber heat spreader 30, heat from the electronic device 20 or other heat source may be conducted through the walls of the conventional vapor chamber heat spreader 30 to the evaporator side 34, where the heat causes the heat transfer fluid 40 to transition from a liquid to a vapor, as indicated by the arrows in FIG. 4. Heat from the evaporator side 34 is absorbed by the heat transfer fluid 40 during the phase change (latent heat of vaporization). Upon contacting the condenser side 36, the vapors of the heat transfer fluid 40 transition from the vapor phase back to the liquid phase, thereby transferring the latent heat of vaporization to the condenser side 36. The heat transferred to the condenser side 36 is then conducted to the cooling surface 37 of the conventional vapor chamber heat spreader 30, where the heat is removed to a heat sink. The liquid phase of the heat transfer fluid 40 flows back along the interior surfaces of the conventional vapor chamber heat spreader 30 to the evaporator side 34. Thus, during operation of the conventional vapor chamber heat spreader 30, heat is transferred from the evaporator side 34 to the condenser side 36 through the phase changes of the heat transfer fluid 40.

Figure 5:
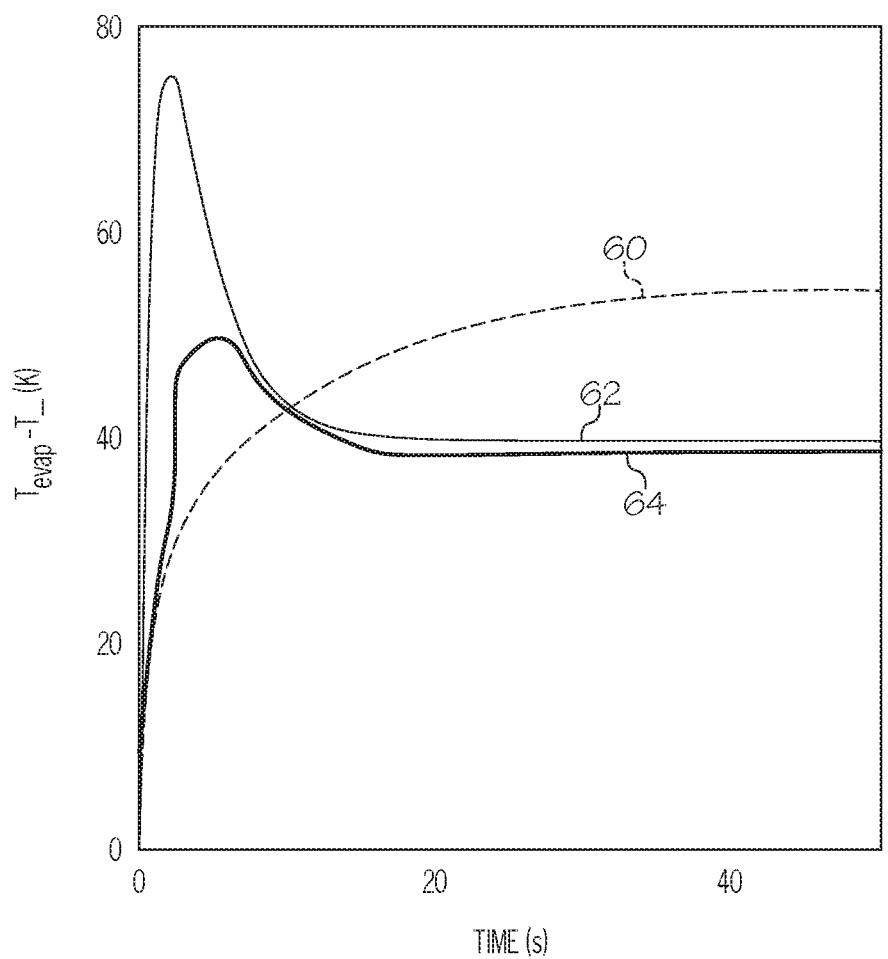
FIG. 5 graphically depicts a thermal response of the vapor chamber heat spreader of FIG. 1 to a step change in heat flux compared to the thermal response of the solid metal heat spreader of FIG. 3 and conventional vapor chamber heat spreader of FIG. 4 to the same step change in heat flux, according to one or more embodiments shown and described herein.

Referring to FIG. 5, the thermal responses of the solid metal heat spreader 26 of FIG. 3 comprising solid copper and the conventional vapor chamber heat spreader 30 of FIG. 4 to a step change in heat flux from the heat source of from 0 watts (W) to 4 W is graphically depicted. For the data in FIG. 5, the solid metal heat spreader 26 and conventional vapor chamber heat spreader 30 have the same exterior dimensions (i.e., an overall thickness of 100 micrometers (am)), and convective heat transfer from the cooling surface of the heat spreaders is characterized by an ambient temperature of 300 Kelvin (27° C.) and a convective heat transfer coefficient of 30 watts per meter squared kelvin (W/(m$^2$*K)). Data series 60 is the thermal response for the solid metal heat spreader 26, and data series 62 is the thermal response for the conventional vapor chamber heat spreader 30. As shown in FIG. 5, the transient thermal response of the solid metal heat spreader (data series 60) shows a gradual increase in the temperature of the solid metal heat spreader from the ambient temperature to steady state. The transient thermal response of the solid metal heat spreader (data series 60) resembles a first order response to the step change in temperature. However, the steady state temperature of the solid state heat spreader is greater than for the conventional vapor chamber heat spreader (data series 62), meaning that, at steady state, the solid metal heat spreader maintains the electronic device 20 or other heat source at a greater temperature, which may cause damage to the electronic device 20 or other heat source.

In contrast, the conventional vapor chamber heat spreader (data series 62) exhibits a steady state temperature substantially less than the solid metal heat spreader (data series 60). Thus, the conventional vapor chamber heat spreader maintains the electronics device 20 or other heat source at a lower temperature compared to the solid metal heat spreader. However, the transient thermal response of the conventional vapor chamber heat spreader 30 is poor. As shown in FIG. 5, the transient thermal response of the conventional vapor chamber heat spreader 30 (data series 62) exhibits an initial overshoot of the steady state temperature, which is similar to the overshoot of an underdamped second order system in response to a step change. This initial overshoot of the temperature of the conventional vapor chamber heat spreader 30 (data series 62) may approach temperatures greater than the steady state temperature of the solid metal heat spreader 26 (data series 60) and up to two times greater than the steady state temperature of the conventional vapor chamber heat spreader 30. These high temperatures during transient thermal response of the conventional vapor chamber heat spreader 30 may cause thermal-related damage to the electronic device 20 or other heat generating device coupled to the conventional vapor chamber heat spreader 30. Thus, there is a continuing need for vapor chamber heat spreaders with improved transient thermal response.

Referring again to FIG. 1, the vapor chamber heat spreaders 102 of the present disclosure include a thermal compensation layer 130 formed or coupled to the inner surfaces 109 of the sidewalls 108. In some embodiments, the fin surfaces 128 of the fins 126 may also include the thermal compensation layer 130. As previously discussed, the thermal compensation layer 130 includes a plurality of core-shell PC particles 132 embedded in a wicking structure, such as sidewall wick 150. The core-shell PC particles 132 include a core that contains a PCM. The core-shell PC particles 132 of the thermal compensation layer 130 increase the heat capacity of the vapor chamber heat spreader 102 compared to a conventional vapor chamber heat spreader 30 (FIG. 3). The increased heat capacity provided by the core-shell PC particles 132 in the thermal compensation layer 130 may cause the vapor chamber heat spreader 102 of the present disclosure to exhibit a superior transient thermal response compared to the conventional vapor chamber heat spreader 30.

Referring again to FIG. 5, the thermal response of the vapor chamber heat spreader 102 of the present disclosure is also depicted (data series 64) under the same heat flux, convective heat transfer parameters, and heat spreader overall thickness previously described for the solid metal heat spreader 26 and conventional vapor chamber heat spreader 30. As shown in FIG. 5, the vapor chamber heat spreader 102 of the present disclosure (data series 64) exhibits the same steady state performance as the conventional vapor chamber heat spreader (data series 62), which at steady state is at a lower temperature compared to the solid metal heat spreader (data series 60). However, the transient thermal response of the vapor chamber heat spreader 102 (data series 64) is superior to the transient thermal response of the conventional vapor chamber heat spreader 30 (data series 62). Although the transient thermal response of the vapor chamber heat spreader 102 still exhibits overshoot of the steady state temperature, the magnitude of the overshoot is reduced to less than ⅓ of the magnitude of the overshoot of the conventional vapor chamber heat spreader 30, and the maximum temperature of the vapor chamber heat spreader 102 during the transient thermal response may be less than the steady state temperature achieved by the solid metal heat spreader 26. Thus, it is shown that the vapor chamber heat spreader 102 of the present disclosure may provide steady state thermal performance that is superior to the steady state thermal performance of a solid metal heat spreader 26 and a transient thermal response that is superior to the transient thermal response of conventional vapor chamber heat spreaders 30. The improved transient and steady state thermal response of the vapor chamber heat spreader 102 may, therefore, further reduce thermal-related damage to the electronic device 20 or other heat generating component coupled to the vapor chamber heat spreader 102 compared to other commercially available heat spreaders.

In addition to improving the transient thermal response of the vapor chamber heat spreader 102, the increased heat capacity of the vapor chamber heat spreader 102 provided by the thermal compensation layer 130 having the core-shell PC particles 132 may further prevent dry out of the vapor chamber heat spreader 102 resulting in thermal runaway of the electronics device 20 coupled to the vapor chamber heat spreader 102, which can damage the electronics device 20. The core-shell PC particles 132 may provide additional heat capacity to compensate for periods of increased heat flux. The additional heat capacity may reduce the probability of the temperature of the vapor chamber heat spreader 102 exceeding temperatures above which the heat transfer fluid 40 is entirely in the vapor phase and no longer condenses on the evaporating surface 114 of the evaporator plate 104 (i.e., dry out).

Referring again to FIG. 1, the condenser plate 106 of the vapor chamber heat spreader 102 is spaced apart from the evaporator plate 104, and the plurality of sidewalls 108 extend between the evaporator plate 104 and condenser plate 106 to define at least one vapor chamber 110. In some embodiments, the vapor chamber heat spreader 102 may further include one or a plurality of fins 126 extending between the evaporator plate 104 and the condenser plate 106, the fins 126 dividing the vapor chamber 110 into a plurality of vapor chambers. In some embodiments, each of the plurality of vapor chambers 110 may be isolated from each of the other vapor chambers 110. The vapor chambers 110 may be defined by the evaporating surface 114 of the evaporator plate 104, the condensing surface 120 of the condenser plate 106, and the inner surfaces 109 of the sidewalls 108. In embodiments having fins 126, the vapor chambers 110 may be further defined by the fin surfaces 128 of the fins 126.

The evaporator plate 104, the condenser plate 106, the sidewalls 108, and optionally the fins 126 may include a thermally conductive material, such as a thermally conductive metal for example, which is capable of conducting heat away from the electronic device 20 or other heat source in thermal communication with the vapor chamber heat spreader 102. In some embodiments, the evaporator plate 104, the condenser plate 106, the sidewalls 108, and optionally the fins 126 may include a thermally conductive metal, such as but not limited to copper (Cu), oxygen free copper, copper alloys, aluminum (Al), aluminum alloys, other thermally conductive metals, or combinations of these. In some embodiments, the evaporator plate 104, the condenser plate 106, the sidewalls 108, and/or the fins 126 may comprise a metal having sufficient electrical conductivity to serve as an electrode in an electroplating process.

The evaporator plate 104 may include an outer surface 112, with which the electronic device 20 or other heat source may be in thermal communication. In some embodiments, the electronic device 20 may be coupled to the outer surface 112 of the evaporator plate 104. The condenser plate 106 may include a cooling surface 122, which may be disposed on a side of the vapor chamber heat spreader 102 opposite the outer surface 112 of the evaporator plate 104. The vapor chamber heat spreader 102 may have an overall thickness of from 50 μm to 10 mm, such as from 100 μm to 5 mm, from 150 μm to 2 mm, or even from 100 μm to 1000 μm. In some embodiments, the cooling surface 122 of the condenser plate 106 may be in thermal communication with a heat sink, such as a heat exchanger, ambient air, or other heat sink.

The vapor chamber heat spreader 102 may further include a heat transfer fluid 40 disposed within the vapor chamber 110. The heat transfer fluid 40 may be a fluid having a vaporization temperature (e.g., boiling temperature) within an operating temperature range of the vapor chamber heat spreader 102 or the electronics device 20 in thermal communication with the vapor chamber heat spreader 102. For example, in some embodiments, the heat transfer fluid 40 may have a vaporization temperature of from 50° C. to 250° C., or from 80° C. to 200° C. Examples of heat transfer fluids 40 may include water, organic alcohols, other organic solvents, or combinations of these. In some embodiments, the heat transfer fluid 40 may be water. During operation of the vapor chamber heat spreader 102, the heat transfer fluid 40 evaporates at an evaporating surface 114 of the evaporator plate 104 and condenses at a condensing surface 120 of the condenser plate 106. The condensed heat transfer fluid 40 then flows along the condenser plate 106 and down the sidewalls 108 and/or fins 126 to the evaporator plate 104 and back to the hot spot to be re-vaporized.

Referring still to FIG. 1, the evaporator plate 104 includes the evaporating surface 114, which is disposed on a side of the evaporator plate 104 opposite the outer surface 112 and oriented towards the interior of the vapor chamber 110. The condenser plate 106 includes the condenser surface 120, which is disposed on a side of the condenser plate 106 opposite the cooling surface 122 of the condenser plate and oriented towards the interior of the vapor chamber 110. The sidewalls 108 include the inner surfaces 109 oriented towards the interior of the vapor chamber.

Referring again to FIG. 1, the vapor chamber heat spreader 102 includes the thermal compensation layer 130. The thermal compensation layer 130 may be formed on the inner surfaces 109 of the sidewalls 108, the fin surfaces 128 of the fins 126, or both. In some embodiments, the vapor chamber heat spreader 102 may also include the thermal compensation layer 130 on the evaporating surface 114 of the evaporator plate 104, the condensing surface 120 of the condenser plate 106, or both. The proportions and dimensions in FIG. 1, as well as in the other drawings, are exaggerated for purposes of illustrating the subject matter and are not intended to be limiting in any way. As previously discussed, the thermal compensation layer 130 includes the plurality of core-shell PC particles 132 at least partially encapsulated within a wicking structure, such as the sidewall wick 150. The wicking structure of the sidewall wick 150 may be a porous metal structure, and the core-shell PC particles 132 may be partially or fully embedded or encapsulated within the wicking structure of the sidewall wick 150.

Figure 6:
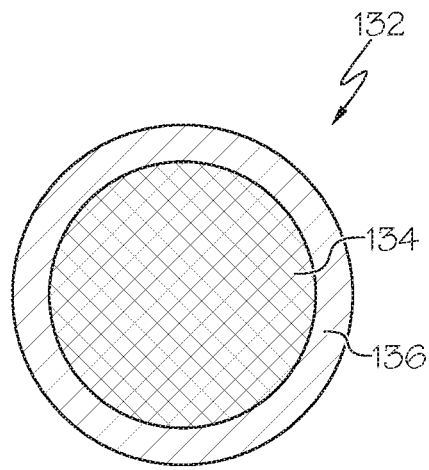
FIG. 6 schematically depicts a cross-sectional view of a core-shell PC particle of the thermal compensation layer of the vapor chamber heat spreader of FIG. 1, according to one or more embodiments shown and described herein.

Referring now to FIG. 6, as previously discussed, the core-shell PC particles 132 include a core 134 fully or partially encapsulated within a shell 136. In some embodiments, the core 134 may be fully encapsulated within the shell 136. The core 134 includes a phase change material (PCM) that changes phase at a phase change (PC) temperature that is within an operating temperature range of the power electronics assembly 100 or the electronic device 20 coupled to the vapor chamber heat spreader 102. The phase change of the PCM may be a change in phase between liquid and solid phases or a change in phase between two solid phases, such as between an amorphous solid phase and a crystalline or partially crystalline solid phase. In some embodiments, the core 134 may include a PCM having a PC temperature that is within an operating temperature range of the electronic device 20. In some embodiments, the core 134 may include a PCM having a PC temperature of from 50° C. to 250° C., such as from 100° C. to 250° C., or even 150° C. to 250° C.

The PCM may be water insoluble. The PCM may include a paraffin or a metal. Paraffin PCMs may include paraffin waxes comprising one or a plurality of saturated hydrocarbons having at least 20 carbon atoms, such as from 20 to 40 carbon atoms and a melt temperature in a range of 50° C. to 250° C. Metal PCMs may include but are not limited to tin (Sn), indium (In), tin alloys, indium alloys, other metals having melt temperatures of from 50° C. to 250° C., or combinations of these. In some embodiments, the PCM of the core 134 may include tin.

Figure 7:
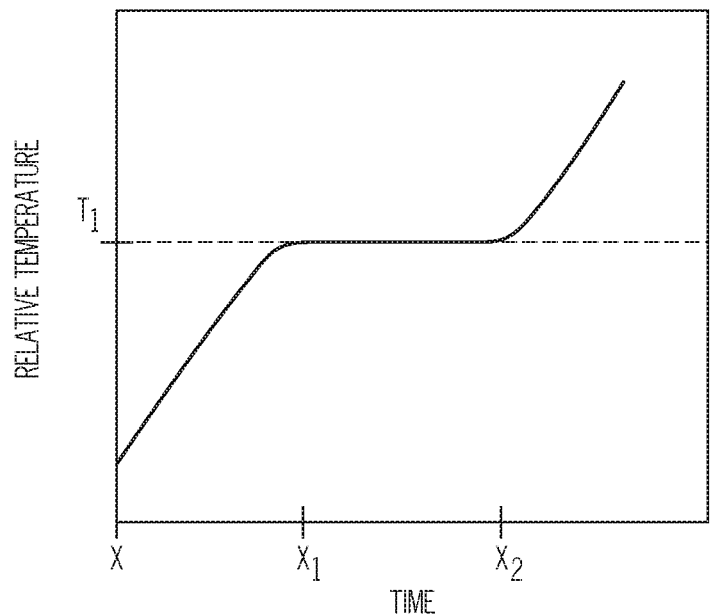
FIG. 7 graphically depicts a temperature of a PCM of the core-shell PC particles of FIG. 7 (y-axis) as a function of time (x-axis) under constant applied heat flux; according to one or more embodiments shown and described herein.

Referring to FIG. 7, the temperature of a PCM in response to constant heat input as a function of time is depicted. In FIG. 7, X is time zero at which the PCM is at a temperature less than the PC temperature at $T_1$. As constant heat is applied between time X and $X_1$, the temperature of the PCM increases. When the PCM reaches the PC temperature $T_1$ at time $X_1$, additional heat input causes the PCM to change phase, such as transitioning from a solid to a liquid or between a crystalline solid and amorphous solid. Between times $X_1$ and $X_2$, the heat input energy is absorbed by the PCM as it changes phase and the temperature of the PCM remains constant. Thus, during the phase change, the PCM absorbs additional heat without a corresponding increase in the temperature. Once all of the PCM has changed phase at time $X_2$, continued heat input may cause the temperature of the PCM to increase again.

The temperature response of the PCM to constant heat removal from the PCM as a function of time may be the reverse of the heat input response in FIG. 7. With the PCM maintained at a temperature greater than the PC temperature $T_1$, constant heat removal may cause the temperature of the PCM to decrease. When the temperature of the PCM reaches the PC temperature $T_1$, continued heat removal causes the PCM to change phase, such as transitioning from a liquid back into a solid. Continued heat removal facilitates the change of phase of the PCM, and the temperature of the PCM remains constant and equal to $T_1$. When all of the PCM has changed phase, further heat removal causes the temperature of the PCM to continue to decrease. Thus, heat may be removed to "reset" the PCM of the core-shell PC particles 132 during periods of low or no heat generation by the electronics device 20.

The shell 136 of the core-shell PC particles 132 includes a shell material. The shell material may be an electrically insulating material. The shell material may also be a material capable of being electroplated or electroless plated with the metal 138 of the thermal compensation layer 130. The shell material may have a melt temperature greater than the PC temperature of the PCM in the core 134. In some embodiments, the shell material may have a thermal conductivity of greater than or equal to 50 watts per meter per degree Kelvin (W/(m*K)), such as from 50 W/(m*K) to 100 W/(m*K). In some embodiments, the shell material may have a melt temperature greater than 250° C., such as greater than 300° C., greater than 350° C., greater than 400° C., or even greater than 500° C.

In some embodiments, the shell material may include a metal oxide or an electrically insulating polymer capable of surviving temperatures greater than the PC temperature of the PCM of the core 134 or greater than the operating temperature range of the power electronics assembly 100 (e.g., greater than about 250° C.). Metal oxides for the shell material may include, but are not limited to silica, alumina, titania, magnesium oxide, zirconia, other metal oxides, or combinations of these. Electrically insulating polymers for the shell material may include, but are not limited to, polyamides, polyimides, polyesters, aromatic polyethers, benzimidazoles, other electrically insulating polymers, or combinations of these. In some embodiments, the shell material may include silica.

In some embodiments, the core-shell PC particles 132 may be spherical core-shell PC particles. Alternatively, in other embodiments, the core-shell PC particles 132 may be non-spherical core-shell PC particles, such as core-shell PC particles having an ovoid, cubic, cylindrical, flat, rod-like, irregular, other shape, or combinations of shapes. In some embodiments, the shape of the core-shell PC particles 132 may be modified to tune the properties of the thermal compensation layer 130.

The core-shell PC particles 132 may have an average particle size of from 1 μm to 500 μm. The average particles size may be an average diameter of a spherical particle or an average of the largest dimension of non-spherical particles. In some embodiments, the core-shell PC particles 132 may have an average particle size of from 1 μm to 100 μm, from 1 μm to 50 μm, from 10 μm to 500 μm, from 10 μm to 100 μm, or even from 10 μm to 50 μm. The core-shell PC particles 132 may be made by known processes, such as but not limited to an air suspension coating process, spray drying process, a solution condensation process, other wet-chemical processes or combinations of these.

Figure 8A:
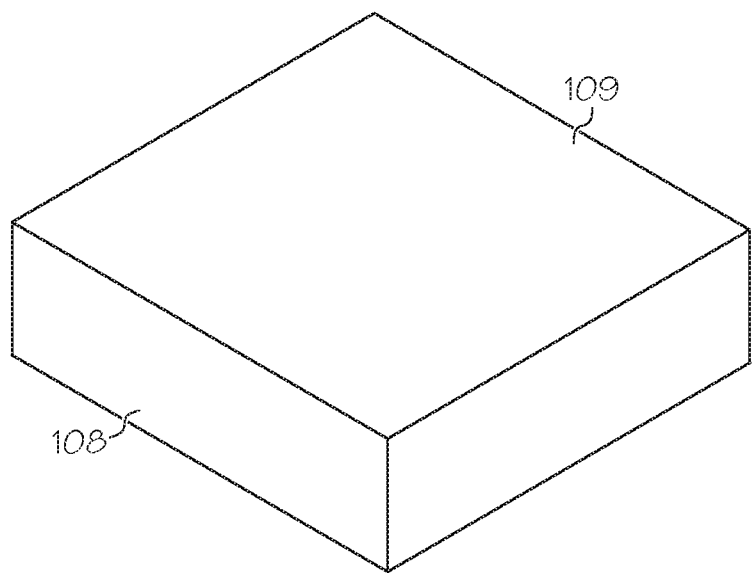
FIG. 8A schematically depicts a perspective view of a portion of the sidewall of the vapor chamber heat spreader of FIG. 1 prior to formation of the thermal compensation layer, according to one or more embodiments shown and described herein.
Figure 8B:
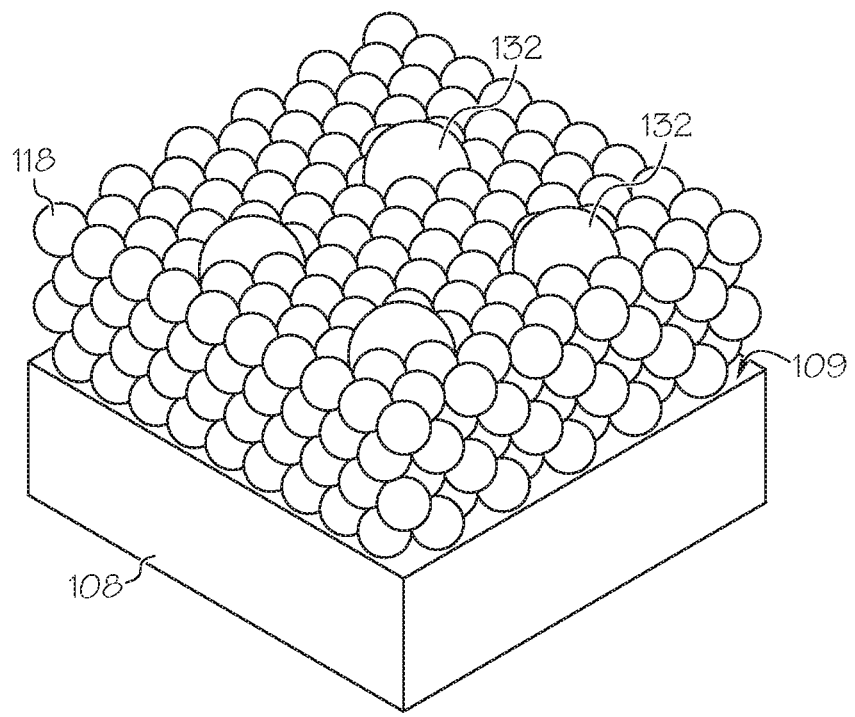
FIG. 8B schematically depicts a perspective view of the portion of the sidewall of FIG. 8A having a plurality of sacrificial opals and core-shell PC particles deposited on an inner surface of the sidewall, according to one or more embodiments shown and described herein.

Referring again to FIG. 1, as previously discussed, the core-shell PC particles 132 may be at least partially or fully embedded within the wicking structure, such as the sidewall wick 150. The wicking structure of the sidewall wick 150 may be a porous metal layer, such as a metal inverse opal (MIO) structure formed on the inner surfaces 109 of the sidewalls 108 and/or the fin surfaces 128 of the fins 126. The MIO structure may be formed by MIO process, which produces a porous metal that has a plurality of interconnected void spaces. Referring now to FIGS. 8A-8E, the MIO process for forming the thermal compensation layer 130 will be described in further detail. FIG. 8A shows a portion of the sidewall 108 prior to formation of the thermal compensation layer 130. Referring to FIG. 6B, the MIO process for forming the thermal compensation layer 130 may include forming a template on the inner surface 109 of the sidewall 108. In some embodiments, the template may include a plurality of sacrificial opals 118 and a plurality of core-shell PC particles 132 deposited onto the inner surface 109 of the sidewall 108. In some embodiments, the core-shell PC particles 132 may be inter-dispersed with the sacrificial opals 118.

The sacrificial opals 118 may include a material that may be removed from the MIO structure to produce the matrix of interconnected void spaces. The sacrificial opals 118 may include, but are not limited to, materials that dissolve in the presence of a solvent, materials that can be etched away by an etchant, materials that vaporize or decompose in response to thermal treatment, other removable materials, or combinations thereof. In some embodiments, the sacrificial opals 118 may include a polymer material, such as polystyrene, polyethylene, polypropylene, other polymers, copolymers thereof, and combinations of these. In some embodiments, the sacrificial opals 118 may be polystyrene opals. The sacrificial opals 118 may have a shape that is spherical, cylindrical, ovoid, irregular shape, other shape, or combinations of shapes. In some embodiments, the sacrificial opals 118 may be microspheres. The sacrificial opals 118 may have an average particle size of from 1 nm to 100 μm, such as from 20 nm to 80 μm, from 50 nm to 50 μm, or from 100 nm to 10 μm. In some embodiments, the sacrificial opals 118 may include opals of different sizes.

The sacrificial opals 118, the core-shell PC particles 132, or both may be deposited on the surface by a drop casting process or other particle deposition process. The sacrificial opals 118 and/or core-shell PC particles 132 may be deposited in a non-random array or may be randomly deposited on the surface (i.e., the inner surface 109 of the sidewall 108 or fin surfaces 128).

Figure 8C:
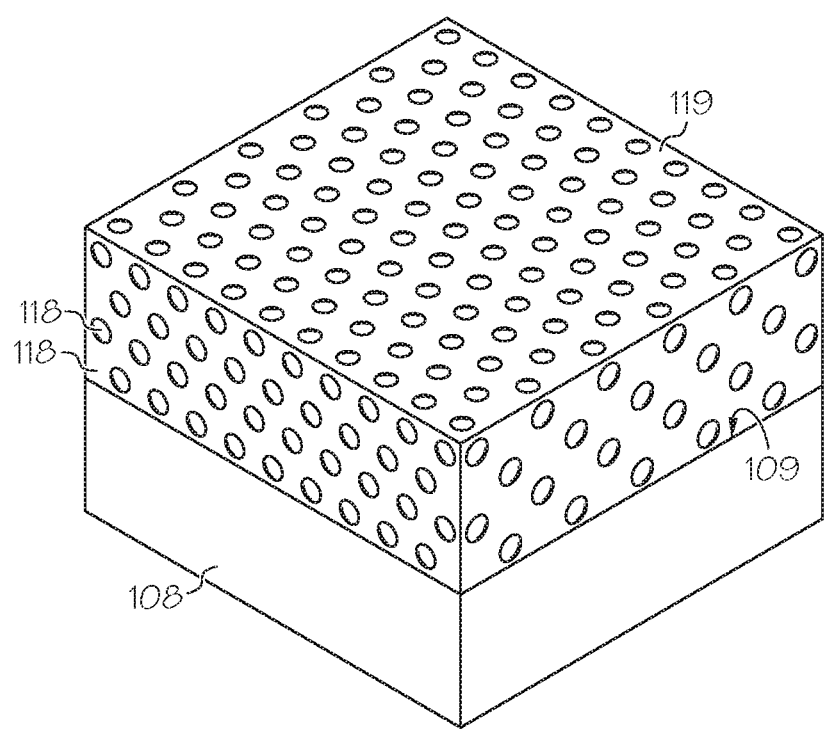
FIG. 8C schematically depicts a perspective view of the portion of the sidewall of FIG. 8B in which a metal has been electroplated over the plurality of sacrificial opals and core-shell-PC particles, according to one or more embodiments shown and described herein.

Referring to FIG. 8C, the MIO process for forming thermal compensation layer 130 may further include depositing a wick metal 119 over the plurality of sacrificial opals 118 and core-shell PC particles 132, to form a wick metal layer with the plurality of sacrificial opals 118 and core-shell PC particles 132 embedded therein. Depositing the wick metal 119 may include electroplating or electroless plating the wick metal 119 over the plurality of sacrificial opals 118 and core-shell PC particles 132. In some embodiments, the sacrificial opals 118 and/or core-shell PC particles 132 may be treated with a seeding composition, such as copper sulfate or other metal compound, prior to electroplating to facilitate electroplating or electroless plating of the wick metal 119.

The wick metal 119 may include any metal that can be electroplated or electroless plated. In some embodiments, the wick metal 119 of the sidewall wick 150 may be a metal having a melt temperature greater than the operating temperature range of the vapor chamber heat spreader 102 and/or the electronics device 20 coupled thereto. In some embodiments, the wick metal 119 may have a thermal conductivity greater than 50 W/(m*K), such as greater than 100 W/(m*K), or even greater than 150 W/(m*K). The wick metal 119 of the sidewall wick 150 may include, but is not limited to, copper (Cu), nickel (Ni), aluminum (Al), silver (Ag), zinc (Zn), magnesium (Mg), other metal, alloys of these metals, or combinations thereof. In some embodiments, the wick metal 119 may be copper or a copper alloy such that the thermal compensation layer 130 may be a copper inverse opal (CIO) layer.

Figure 8D:
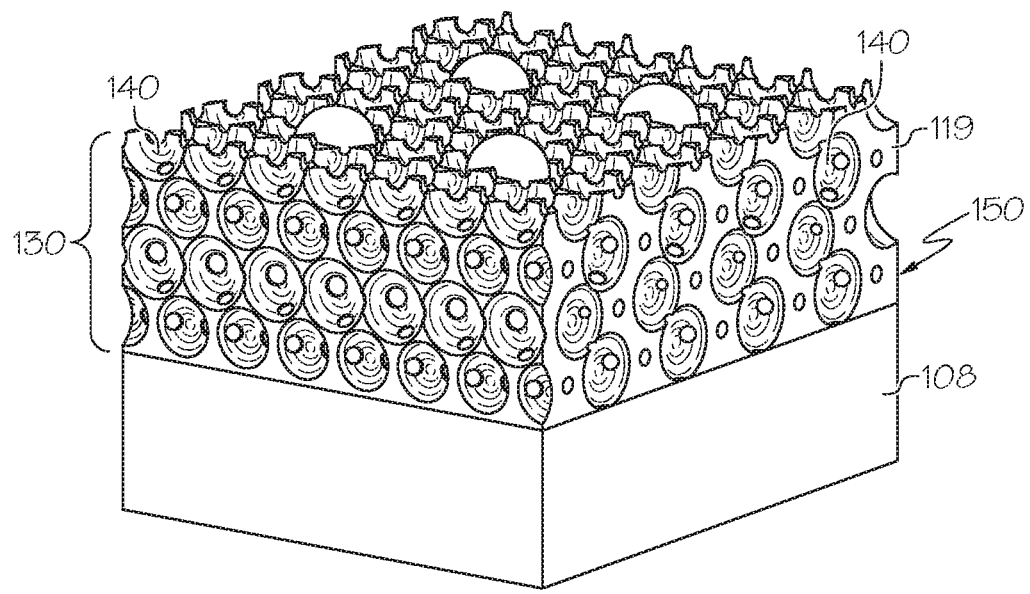
FIG. 8D schematically depicts a perspective view of the portion of the sidewall of FIG. 8C in which the plurality of sacrificial opals have been removed to produce the thermal compensation layer that includes the core-shell PC particles embedded within the sidewall wick, which comprises a metal inverse opal (MIO) structure, according to one or more embodiments shown and described herein.

Referring to FIG. 8D, following deposition of the wick metal 119, the MIO process may include treating the wick metal 119 to remove the sacrificial opals 118 or other template to produce the wicking structure of the sidewall wick 150. In some embodiments, treating the wick metal 119 to remove the sacrificial opals 118 may include treating the wick metal 119 with a solvent to dissolve the sacrificial opals 118, but not dissolve the core-shell PC particles 132. For example, when polystyrene microspheres are used as the sacrificial opals 118, the wick metal 119 may be treated with an organic solvent, which may dissolve the polystyrene microspheres while leaving the core-shell PC particles 132 intact and embedded in the wicking structure. In other embodiments, treating the wick metal 119 to remove the sacrificial opals 118 may include etching the sacrificial opals 118 out of the wick metal 119. In still other embodiments, treating the wick metal 119 to remove the sacrificial opals 118 may include subjecting the wick metal 119 to a thermal treatment at a temperature and for a period of time sufficient to decompose or vaporize the sacrificial opals 118. Other methods for removing the sacrificial opals 118 from the wick metal 119 may also be employed.

Figure 8E:
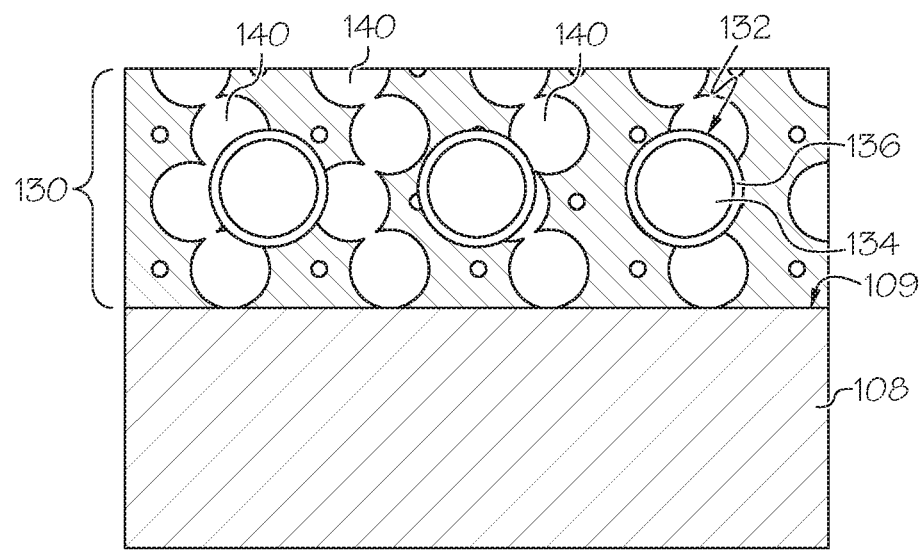
FIG. 8E schematically depicts a side cross-sectional view of the portion of the sidewall of FIG. 8D in which the core-shell PC particles are shown embedded in the MIO layer of the sidewall wick, according to one or more embodiments shown and described herein.

Referring to FIGS. 8D and 8E, removal of the sacrificial opals 118 from the wick metal 119 may produce the sidewall wick 150, which includes the wick metal 119 with a plurality of interconnected voids 140 and core-shell PC particles 132 distributed throughout the wick metal 119. FIG. 8E shows a side cross-sectional view of the portion of the sidewall 108 and thermal compensation layer 130 of FIG. 8D. As shown in FIG. 8E, the core-shell PC particles 132 may be fully embedded in the wicking structure of the sidewall wick 150. Although shown in FIG. 8E as a single layer of core-shell PC particles 132, it is understood that, in some embodiments, the thermal compensation layer 130 may also include a plurality of layers of core-shell PC particles 132.

The sidewall wick 150 may have a defined porosity determined by the average particle size, shape, and packing density of the sacrificial opals 118 and core-shell PC particles 132 used to make the sidewall wick 150. The porosity of the sidewall wick 150 may be modified by changing the size, shape, or packing density of the sacrificial opals 118 and core-shell PC particles 132 during the MIO process. In some embodiments, the porosity of the sidewall wick 150 may be modified after formation of the MIO layer by treating the sidewall wick 150 with an etchant. In these embodiments, the etchant may remove wick metal 119 from the inner surfaces of the plurality of voids 140, thereby increasing the size of the voids 140 and increasing the porosity of the sidewall wick 150. The sidewall wick 150 may have a thickness of from 10 nm to 1,000 μm, such as from 50 nm to 750 μm, from 100 nm to 500 μm, from 500 nm to 500 μm, from 500 μm to 300 μm, from 1 μm to 200 μm, or from 1 μm to 100 μm.

In some embodiments, the thermal compensation layer 130 may be formed directly on the inner surface 109 of the sidewalls 108 and/or fin surfaces 128 of the fins 126. "Formed directly" refers to the thermal compensation layer 130 being in direct contact with the surface with no intervening bonding layer. Alternatively, in other embodiments, the thermal compensation layer 130 may be formed independently and then bonded to the inner surface 109 of the sidewalls 108, the fin surfaces 128 of the fins 126, or other surface of the vapor chamber heat spreader 102. In some embodiments, the MIO process may be repeated one or more times to produce a plurality of thermal compensation layers 130, such as 2, 3, 4, 5, 6, or more than 6 thermal compensation layers 130 on the inner surfaces 109 of the sidewalls 108, or other surfaces. In some embodiments, each of the thermal compensation layers 130 may have core-shell PC particles 132 of different average particle size or with different PCMs in the cores 134. Thus, multiple thermal compensation layers 130 can be formed on the inner surfaces 109 of the sidewalls 108, or other surfaces disclosed herein, to produce a graduated heat capacity that changes through the thickness of the multiple thermal compensation layers 130. Using multiple thermal compensation layers 130 to produce a graduated heat capacity may enable the thermal response of the vapor chamber heat spreader 102 to be further tuned to operation of the electronics devices 20 in thermal communication therewith.

In some embodiments, the thermal compensation layer 130 may additionally be formed on the evaporating surface 114 of the evaporator plate 104, the condensing surface 120 of the condenser plate 106, or both. For example, in some embodiments, the evaporator plate 104 may include the thermal compensation layer 130 formed directly on the evaporating surface 114 of the evaporator plate 104. In these embodiments, the thermal compensation layer 130 may include the plurality of core-shell PC particles 132 embedded in an evaporator wick. The thermal compensation layer 130 may be formed on the condensing surface 120 of the condenser plate 106 and may include a plurality of core-shell PC particles 132 embedded within a condenser wick.

Figure 9A:
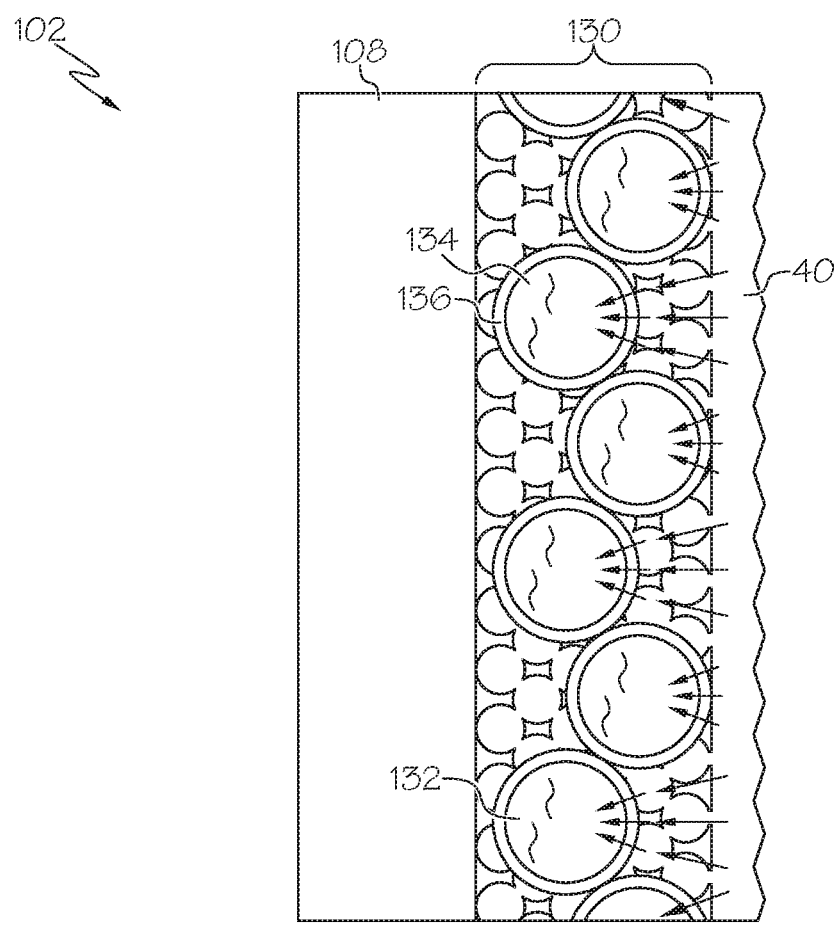
FIG. 9A schematically depicts a portion of the thermal compensation layer of the vapor chamber heat spreader of FIG. 1 during operation of the vapor chamber heat spreader in response to a high heat flux condition, according to one or more embodiments shown and described herein.

Referring now to FIGS. 1 and 9A, operation of the thermal compensation layer 130 will be described in further detail. During operation of the power electronics assembly 100, the electronic device 20 may generate heat. A substantial portion of the heat generated by the electronic device 20 may be conducted into and through the vapor chamber heat spreader 102. A portion of the heat transferred into the vapor chamber heat spreader 102 may be transferred to the thermal compensation layer 130 through conduction from the heat transfer fluid 40 flowing from the condenser plate 106 to the evaporator plate 104 or from the vapors inside the vapor chamber 110. For example, FIG. 9A illustrates the liquid phase heat transfer fluid 40, which has been condensed at the condensing surface 120, flowing along and through the sidewall wick 150 of the thermal compensation layer 130 on its path back to the evaporator plate 104. Heat may also be conducted through the sidewalls 108 and/or fins 126 to the thermal compensation layer 130. Heat from the vapor chamber heat spreader 102 may be conducted into the wick metal 119 of the thermal compensation layer 130. The wick metal 119 may conduct the heat to the plurality of core-shell PC particles 132. Initially, heat conducted to the core-shell PC particles 132 may increase the temperature of the core-shell PC particles 132 until the PCM in the core 134 reaches the PC temperature of the PCM, as shown in FIG. 7.

Referring again to FIG. 9A, once the temperature of the PCM in the core 134 of the core-shell PC particle 132 reaches the PC temperature, additional absorption of heat by the PCM may cause the PCM to change phase at constant temperature to a higher energy phase (e.g., liquid phase). For example, in some embodiments, the PCM may be indium, tin or paraffin, and the heat input may cause the PCM to transition from a solid to a liquid at constant temperature. During the phase change, the PCM of the core-shell PC particle 132 may enable the vapor chamber heat spreader 102 to absorb additional heat generated by the electronic device 20 or other heat source without a further increase in the temperature of the vapor chamber heat spreader 102. Thus, the core-shell PC particles 132 may increase the heat capacity of the vapor chamber heat spreader 102. During the phase change of the PCM, the vapor chamber heat spreader 102 may continue to transfer heat from the outer surface 112 to the cooling surface 122 (FIG. 1).

Figure 9B:
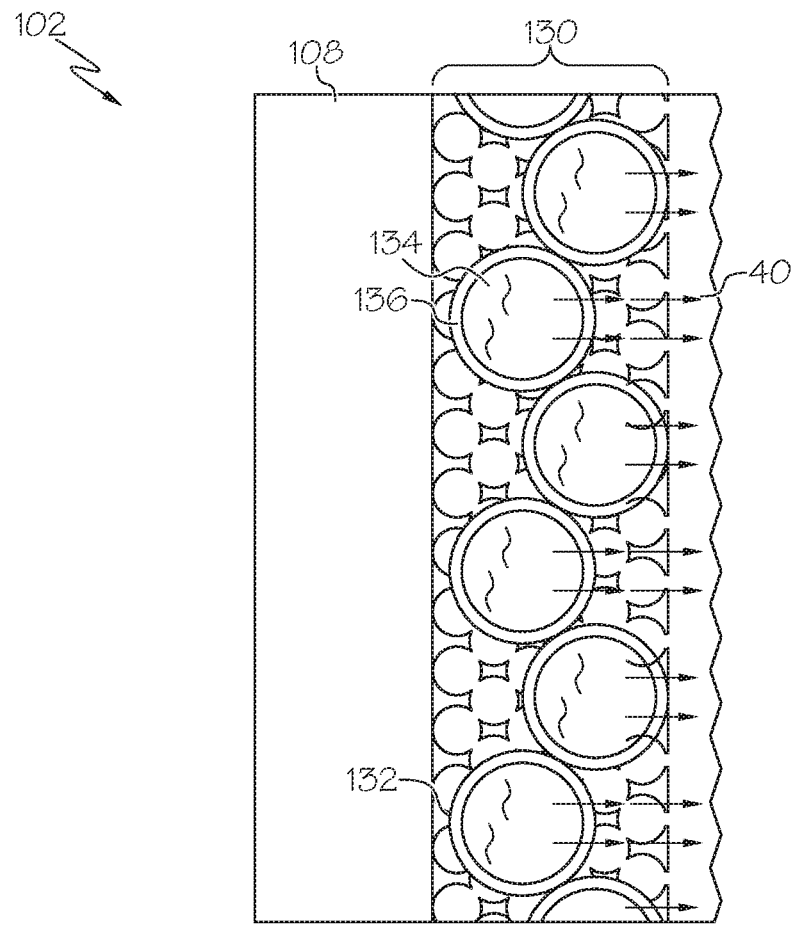
FIG. 9B schematically depicts the portion of the thermal compensation layer of FIG. 9A at a time after the high heat flux condition when the electronic device coupled to the vapor chamber heat spreader is idle and heat stored in the thermal compensation layer is conducted away, according to one or more embodiments shown and described herein.

Referring now to FIG. 9B, when the electronic device 20 (FIG. 1) is in an idle state or reduced activity state in which less heat or no heat is generated, the wick metal 119, heat transfer fluid 40, and/or the vapor chamber heat spreader 102 may conduct heat away from the core-shell PC particle 132 in the thermal compensation layer 130 as shown by the arrows in FIG. 9B. Continued heat removal from the core-shell PC particles 132 may cause the PCM in the cores 134 of the core-shell PC particles 132 to change phase back into the lower energy phase (e.g., solid phase). For example, in embodiments in which the PCM is paraffin or a metal such as tin, the heat removal may transition the PCM from a liquid back into a solid. Thus, during periods of reduced load on the electronic device 20, the heat absorbed by the core-shell PC particles 132 may continue to be removed so that PCM in the cores 134 of the core-shell PC particles 132 can be reset to the lower energy phase (e.g., solid phase) in preparation for the next peak loading period of the electronic device 20.

As previously described, the presence of the core-shell PC particles 132 in the thermal compensation layer 130 increases the heat capacity of the vapor chamber heat spreader 102. The increased heat capacity resulting from the thermal compensation layer 130 may enable the vapor chamber heat spreader 102 to remove more heat from the electronic device 20 compared to the conventional vapor chamber heat spreaders 30 (FIG. 3) that do not have the thermal compensation layer 130. During transient periods of operation of the power electronics assembly 100, such as start-up of the electronic device 20 from an idle or low power state, the initial heat flux may be absorbed by the core-shell PC particles 132 at constant temperature while vaporization of the heat transfer fluid 40 commences. Thus, the initial temperature overshoot in the transient thermal response of the vapor chamber heat spreader 102 can be reduced. Additionally, during periods of high heat flux, the greater heat capacity of the vapor chamber heat spreader 102 may enable the vapor chamber heat spreader 102 to absorb the excess heat without experiencing dry out, which can lead to thermal runaway and damage to the electronic device 20 or other component or heat source thermally coupled to the vapor chamber heat spreader 102.

Figure 10:
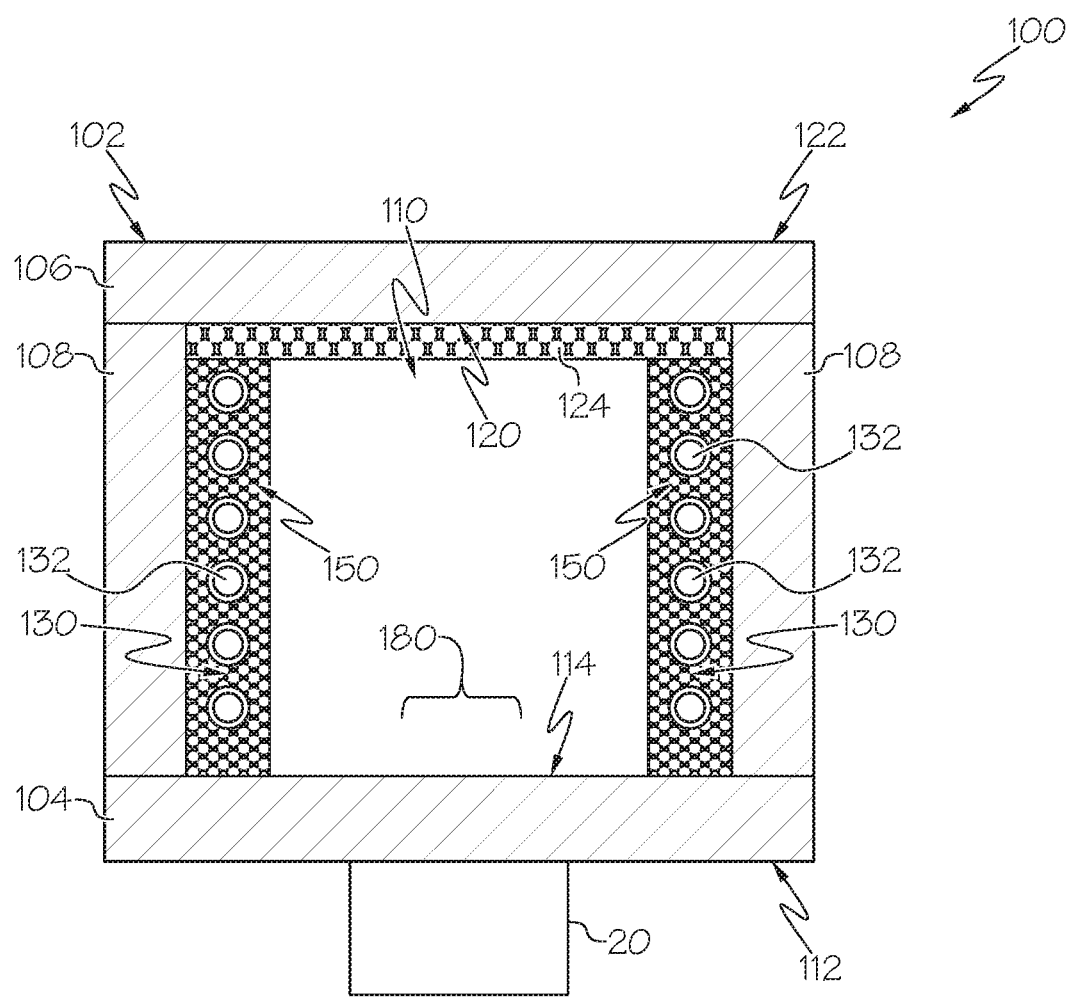
FIG. 10 schematically depicts a side cross-sectional view of another embodiment of a vapor chamber heat spreader in which the sidewalls and fins include the thermal compensation layer and a condenser plate of the vapor chamber heat spreader includes a condenser wick, according to one or more embodiments shown and described herein.

Referring now to FIG. 10, in some embodiments, the vapor chamber heat spreader 102 may further include a condenser wick 124 comprising a wicking structure coupled to the condensing surface 120 of the condenser plate 106. The condenser wick 124 may be a porous metal layer, such as an MIO layer formed on the condensing surface 120 of the condenser plate 106. The MIO layer of the condenser wick 124 may be formed by the MIO process previously described in relation to the thermal compensation layer 130, except that, in some embodiments, the MIO process may not include core-shell-PC particles. The sacrificial opals for the condenser wick 124 may have a shape that is spherical, cylindrical, ovoid, irregular shape, other shape, or combinations of shapes. In some embodiments, the sacrificial opals for the condenser wick 124 may be microspheres. The sacrificial opals for the condenser wick 124 may have an average particle size of from 1 nm to 100 μm, such as from 20 nm to 80 μm, from 50 nm to 50 μm, or from 100 nm to 10 μm.

The porosity of the condenser wick 124 may be increased or decreased by changing the average particle size or shape of the sacrificial opals utilized in the MIO process. The condenser wick 124 may have the same or different porosity than the sidewall wick 150. For example, in some embodiments, the same sacrificial opals may be used for both the condenser wick 124 and the sidewall wick 150 so that the porosity of the condenser wick 124 may be generally the same as the porosity of the sidewall wick 150. In other embodiments, sacrificial opals deposited on the condensing surface 120 may have a different average particle size or shape than the sacrificial opals used for the sidewall wick 150, resulting in a different porosity of the condenser wick 124 compared to the sidewall wick 150.

The wick metal of the condenser wick 124 may include any metal that can be electroplated or electroless plated. In some embodiments, the wick metal of the condenser wick 124 may be a metal having a melting temperature greater than the operating temperature range of the vapor chamber heat spreader 102 and/or the electronics device 20 coupled thereto. In some embodiments, the wick metal of the condenser wick 124 may have a thermal conductivity greater than 50 W/(m*K), such as greater than 100 W/(m*K), or even greater than 150 W/(m*K). The wick metal of the condenser wick 124 may include, but is not limited to, copper (Cu), nickel (Ni), aluminum (Al), silver (Ag), zinc (Zn), magnesium (Mg), other metal, alloys of these metals, or combinations thereof. The wick metal of the condenser wick 124 may be the same or different than the wick metal of the sidewall wick 150. The condenser wick 124 may have a thickness of from 10 nm to 1,000 μm, such as from 50 nm to 750 μm, from 100 nm to 500 μm, from 500 nm to 500 μm, from 500 μm to 300 μm, from 1 μm to 200 μm, or from 1 μm to 100 μm.

The condenser wick 124 may provide additional surface area to the condensing surface 120 of the condenser plate 106 to facilitate transition of the heat transfer fluid 40 from the vapor phase back to the liquid phase. The additional surface area provided by the condenser wick 124 may increase the interfacial area between the liquid and vapor phase of the heat transfer fluid 40 at the condensing surface 120, which may increase the rate of condensation of the heat transfer fluid 40. Additionally, the condenser wick 124 may transport the condensed heat transfer fluid 40 along the condensing surface 120 of the condenser plate 106 to the sidewalls 108 and/or fins 126 by capillary flow through the pores of the condenser wick 124. The condensation rate and capillary flow rate in the condenser wick 124 may be increased or decreased by modifying the porosity of the condenser wick 124 as previously described herein.

Figure 11:
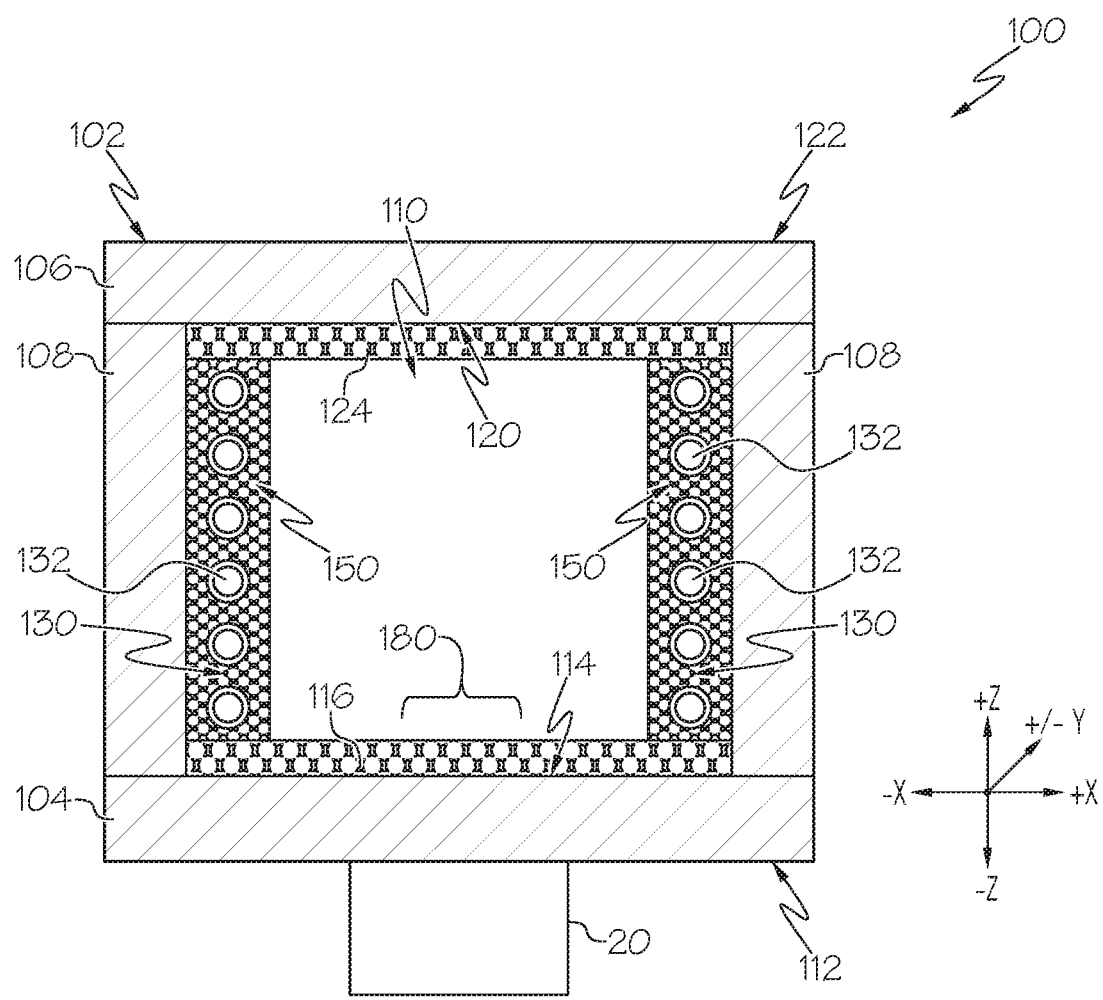
FIG. 11 schematically depicts a side cross-sectional view of another embodiment of a vapor chamber heat spreader in which the sidewall includes the thermal compensation layer, the evaporator plate includes an evaporator wick, and the condenser includes a condenser wick, according to one or more embodiments shown and described herein.

Referring to FIG. 11, in some embodiments, the vapor chamber heat spreader 102 may further include an evaporator wick 116 comprising a wicking structure coupled to the evaporating surface 116 of the evaporator plate 104. The evaporator wick 116 may be a porous metal layer, such as an MIO layer formed on the evaporating surface 114 of the evaporator plate 104. The MIO layer of the evaporator wick 116 may be formed by the MIO process previously described in relation to the thermal compensation layer 130 and sidewall wick 150, except that the MIO process may be used to produce the evaporator wick 116 without the core-shell PC particles 132 embedded therein. The sacrificial opals for the evaporator wick 116 may have any of the properties of the sacrificial opals previously described in relation to the sidewall wick 150 or the condenser wick 124.

The porosity of the evaporator wick 116 may be increased or decreased by changing the average particle size or shape of the sacrificial opals utilized in the MIO process. The evaporator wick 116 may have the same or different porosity than the sidewall wick 150, the condenser wick 124, or both. For example, in some embodiments, the same sacrificial opals may be used for the condenser wick 124, the sidewall wick 150, and the evaporator wick 116 so that the porosity of the evaporator wick 116 may be generally the same as the porosity of the sidewall wick 150 and condenser wick 124. In other embodiments, sacrificial opals for making the evaporator wick 116 may have a different average particle size or shape than the sacrificial opals used for forming the sidewall wick 150 and/or the condenser wick 124, resulting the evaporator wick 116 having a different porosity compared to the sidewall wick 150 and/or condenser wick 124.

The wick metal of the evaporator wick 116 may include any metal that can be electroplated or electroless plated. In some embodiments, the wick metal of the evaporator wick 116 may be a metal having a melting temperature greater than the operating temperature range of the vapor chamber heat spreader 102 and/or the electronics device 20 coupled thereto. In some embodiments, the wick metal of the evaporator wick 116 may have a thermal conductivity greater than 50 W/(m*K), such as greater than 100 W/(m*K), or even greater than 150 W/(m*K). The wick metal of the evaporator wick 116 may include, but is not limited to, copper (Cu), nickel (Ni), aluminum (Al), silver (Ag), zinc (Zn), magnesium (Mg), other metal, alloys of these metals, or combinations thereof. The wick metal of the evaporator wick may be the same or different than the wick metal of the sidewall wick 150 and/or the condenser wick 124. The evaporator wick 116 may have a thickness of from 10 nm to 1,000 μm, such as from 50 nm to 750 μm, from 100 nm to 500 μm, from 500 nm to 500 μm, from 500 m to 300 μm, from 1 μm to 200 μm, or from 1 μm to 100 μm.

Referring still to FIG. 11, the evaporator wick 116 may provide additional surface area to the evaporating surface 114 of the evaporator plate 104 to facilitate transition of the heat transfer fluid 40 from the liquid phase to the vapor phase. The additional surface area provided by the evaporator wick 116 may increase the interfacial area between the liquid and vapor phase of the heat transfer fluid at the hot spot 180. As used herein, the "hot spot" may refer to a region of the evaporator plate 104 proximate the electronics device 20 or other heat source at which the temperatures of the evaporating surface 114 of the evaporator plate 104 are the greatest. Additionally, the evaporator wick 116 may convey the condensed heat transfer fluid 40 from the sidewalls 108 and/or fins 126 back to the hot spot 180 by capillary flow through the pores of the evaporator wick 116. The vaporization rate and capillary flow rate in the evaporator wick 116 may be increased or decreased by modifying the porosity of the evaporator wick 116 as previously described herein.

Referring still to FIG. 11, operation of the vapor chamber heat spreader 102 to remove heat from the electronic device 20 or other heat source in thermal communication with the outer surface 112 of the vapor chamber heat spreader 102 will be further described. During operation, the electronics device 20 may generate heat. A portion of the heat from the electronics device 20 may be conducted into the evaporator plate 104 and through the evaporator plate 104 to the evaporating surface 114 and the evaporator wick 116 formed thereon. The heat conducted through the evaporator plate 104 may cause at least a portion of the heat transfer fluid 40 within the pores of the evaporator wick 116 to transition from the liquid phase to the vapor phase, thereby absorbing heat (i.e., latent heat of vaporization) from the evaporating surface 114. The vapors of the heat transfer fluid 40 may pass upward (i.e., in the +Z direction of the coordinate axis of FIG. 9) through the pores of the evaporator wick 116 into the vapor chamber 110.

Heat is constantly removed from the cooling surface 122 to the heat sink (not shown), which maintains the condensing surface 120 and the condenser wick 124 at a temperature less than the temperature of the evaporating surface 114 and the evaporating wick 116. In some embodiments, the temperature of the condensing surface 120 and/or condenser wick 124 may be less than a boiling temperature of the heat transfer fluid 40. When the vapors of the heat transfer fluid 40 contact the condensing surface 120 and/or the condenser wick 124, the heat transfer fluid 40 transitions from the vapor phase back to the liquid phase. In other words, the heat transfer fluid 40 condenses on the condensing surface 120 and/or on the surfaces of the pores of the condenser wick 124. Transition of the heat transfer fluid 40 from the vapor phase to the liquid phase releases heat (i.e., latent heat of vaporization) to the condenser plate 106. The heat released into the condenser plate 106 may be conducted through the condenser plate 106 to the cooling surface 122, where the heat is removed from the vapor chamber heat spreader 102 to the heat sink.

When the condenser wick 124 is present, the condensed heat transfer fluid 40 may be transported to the sidewalls 108 and/or fins 126 by capillary flow through the porous structure of the condenser wick 124. The liquid phase heat transfer fluid 40 may then flow through the sidewall wick 150 by capillary flow through the porous structure of the sidewall wick 150 from the condenser plate 106 to the evaporator plate 104 (i.e., in the −Z direction of the coordinate axis of FIG. 11). Capillary flow in pores of the evaporator wick 116 may transport the liquid heat transfer fluid 40 laterally (i.e., in the +/−X direction of the coordinate axis in FIG. 9) through the evaporator wick 116 to the hotspot 180, where the heat transfer fluid 40 is then re-vaporized to further absorb heat from the evaporator plate 104.

As previously discussed, during transient periods or periods of high heat flux, additional heat may be absorbed by the PCM of the core-shell PC particles 132 embedded in the thermal compensation layer 130 to transition the PCM to a higher energy phase. Once the vapor chamber heat spreader 102 attains steady state or the heat flux subsides, the heat stored in the PCM of the core-shell PC particles 132 may be released through transition of the PCM back to the lower energy state.

Figure 12:
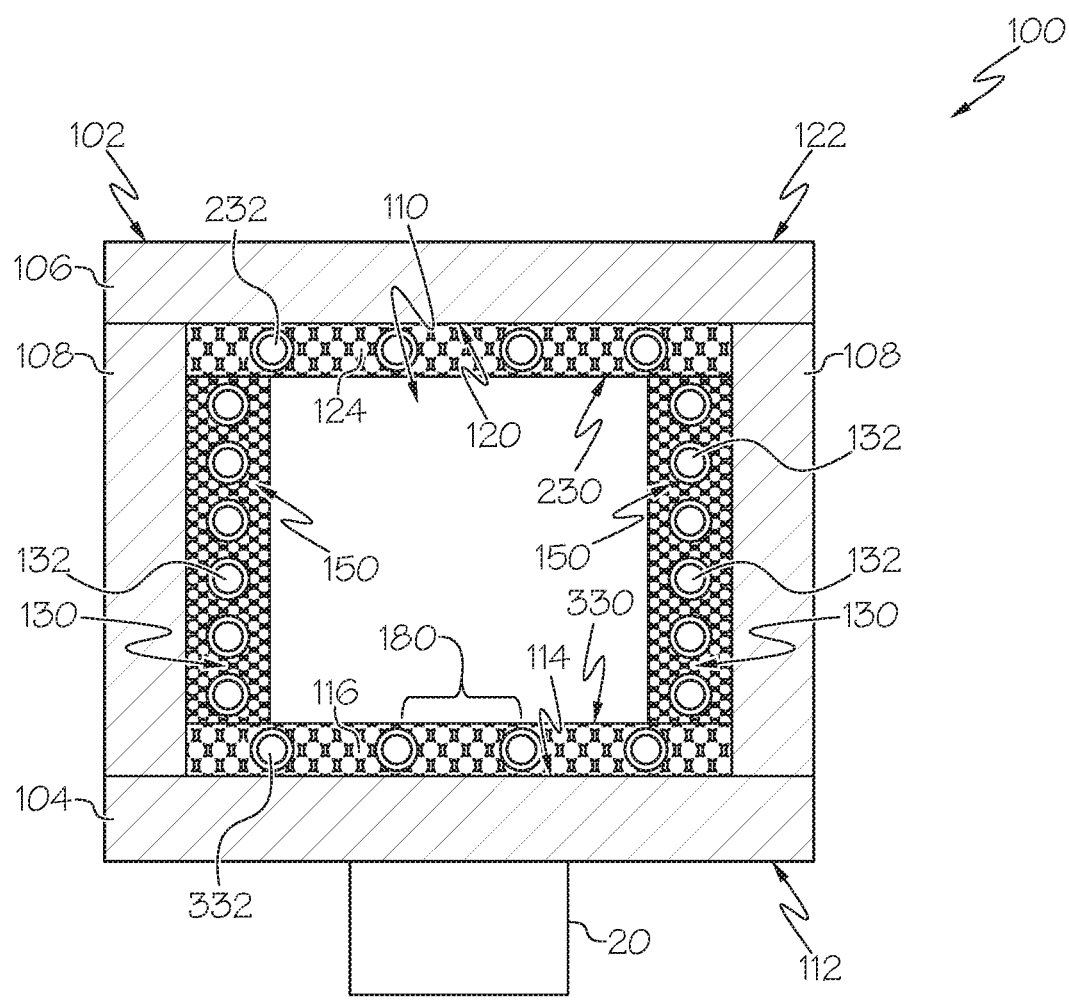
FIG. 12 schematically depicts a side cross-sectional view of yet another embodiment of a vapor chamber heat spreader in which the sidewalls include a thermal compensation layer, the condenser plate includes a condenser thermal compensation layer, and the evaporator plate includes an evaporator thermal compensation layer, according to one or more embodiments shown and described herein.

Referring now to FIG. 12, in some embodiments, the condenser plate 106 may include a condenser thermal compensation layer 230. The condenser thermal compensation layer 230 may include a plurality of condenser core-shell PC particles 232 at least partially embedded within the condenser wick 124. The condenser thermal compensation layer 230 may be formed directly on the condensing surface 120 of the condenser plate 106 so that the condenser thermal compensation layer 230 is in contact with the condensing surface 120. In some embodiments, the condenser thermal compensation layer 230 may be formed separately and bonded to the condensing surface 120 with a bonding layer or bonding agent (not shown).

The condenser core-shell PC particles 232 may include a core comprising a PCM and a shell encapsulating the PCM of the core. The condenser core-shell PC particles 232 may have any of the characteristics or properties previously described for the core-shell PC particles 132 of the thermal compensation layer 130. In some embodiments, the condenser core-shell PC particles 232 may be the same as the core-shell PC particles 132. In other embodiments, the condenser core-shell PC particles 232 may have one of a PCM material, size, shape, or other characteristic different than the core-shell PC particles of the thermal compensation layer 130. In some embodiments, the condenser core-shell PC particles 232 may include a PCM having a different PC temperature than the PCM in the core-shell PC particles 132 of the thermal compensation layer 130. For example, in some embodiments, the PCM of the condenser core-shell PC particles 232 may have a lesser PC temperature than the PCM of the core-shell PC particles 132 of the thermal compensation layer 130, which may enable the condenser thermal compensation layer 230 to be maintained at a lesser temperature to facilitate condensation of the heat transfer fluid 40.

Still referring to FIG. 12, in some embodiments, the evaporator plate 104 may include an evaporator thermal compensation layer 330. The evaporator thermal compensation layer 330 may include a plurality of evaporator core-shell PC particles 332 at least partially embedded within the evaporator wick 116. The evaporator thermal compensation layer 330 may be formed directly on the evaporating surface 114 of the evaporator plate 104 so that the evaporator thermal compensation layer 330 is in contact with the evaporating surface 114. In some embodiments, the evaporator thermal compensation layer 330 may be formed separately and bonded to the evaporating surface 114 with a bonding layer or bonding agent (not shown). Although shown in FIG. 12 as having both a condenser thermal compensation layer 230 and an evaporator thermal compensation layer 330, the vapor chamber heat spreader 102 of the present disclosure may include the condenser thermal compensation layer 230 without the evaporator thermal compensation layer 330 or with just the evaporator wick 116 or may include the evaporator thermal compensation layer 330 without the condenser thermal compensation layer 230 or with just the condenser wick 124.

The evaporator core-shell PC particles 332 may include a core comprising a PCM and a shell encapsulating the PCM of the core. The evaporator core-shell PC particles 332 may have any of the characteristics or properties previously described herein for the core-shell PC particles 132 of the thermal compensation layer 130. In some embodiments, the evaporator core-shell PC particles 332 may be the same as the core-shell PC particles 132 and/or the condenser core-shell PC particles 232. In other embodiments, the evaporator core-shell PC particles 332 may have one of a PCM material, size, shape, or other characteristic different than the core-shell PC particles 132 and/or the evaporator core-shell PC particles 232. In some embodiments, the evaporator core-shell PC particles 332 may include a PCM having a different PC temperature than the PCM in the core-shell PC particles 132 and/or the condenser core-shell PC particles 232. For example, in some embodiments, the PCM of the evaporator core-shell PC particles 332 may have a PC temperature greater than the boiling temperature of the heat transfer fluid 40 and the PCM of the condenser core-shell PC particles 232 may have a PC temperature less than the PC temperature of the evaporator core-shell PC particles 332, such as less than a boiling temperature of the heat transfer fluid 40. In some embodiments, the core-shell PC particles 132 of the thermal compensation layer 130 coupled to the sidewalls 108 and/or fins 126 may have a PC temperature less than the boiling temperature of the heat transfer fluid 40 to make sure that the heat transfer fluid 40 is returned to the evaporator plate 104 in the liquid state.

Figure 13:
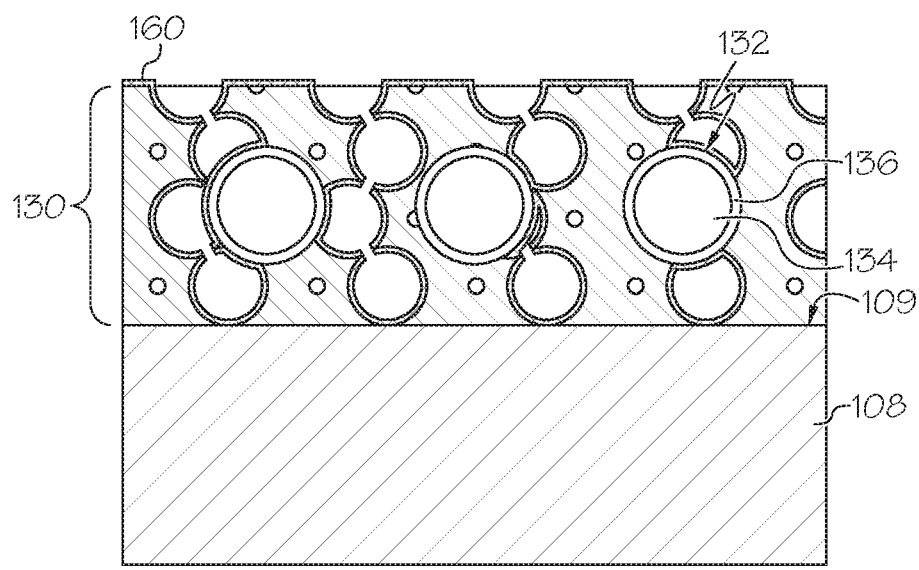
FIG. 13 schematically depicts a side cross-sectional view of an embodiment of the thermal compensation layer of the vapor chamber heat spreader of FIG. 1 in which an atomic layer deposition (ALD) layer has been deposited on the wick structures of the thermal compensation layer, according to one or more embodiments shown and described herein.

Referring to FIG. 13, in some embodiments, the vapor chamber heat spreader 102 may include a coating 160 applied to surfaces or wicking structures of vapor chamber heat spreader 102, such as the evaporating surface 114, the evaporator wick 116, the condensing surface 120, the condenser wick 124, the thermal compensation layer 130, the condenser thermal compensation layer 230 (FIG. 12), the evaporator thermal compensation layer 330 (FIG. 12), or combinations of these. In some embodiments, the coating 160 may be applied to the core-shell PC particles (e.g., core-shell PC particles 132, condenser core-shell PC particles 232, and/or evaporator core-shell PC particles 332) in addition to the wicking structures. For example, in some embodiments, the coating 160 may be applied to the thermal compensation layer 130 so that the coating 160 covers at least a portion of the surfaces of the pores 140 of the sidewall wick 150 and at least a portion of the outer surfaces of the core-shell PC particles 132. The coating 160 may be formed on the surfaces or wicking structures via any deposition method now known or later developed, particularly deposition methods that are suited for the materials used. In some embodiments, the coating 160 may be deposited on the surfaces of the evaporating surface 114, the evaporator wick 116, the condensing surface 120, the condenser wick 124, the thermal compensation layer 130, the condenser thermal compensation layer 230 (FIG. 12), the evaporator thermal compensation layer 330 (FIG. 12), or combinations of these via atomic layer deposition (ALD) or chemical vapor deposition (CVD) processes. In some embodiments, the coating 160 may be an ALD coating.

In some embodiments, the coating 160 may operate to improve transport of the liquid heat transfer fluid 40 through the pores of the wicking structures of the vapor chamber heat spreader 102 (e.g., condenser wick 124, evaporator wick 116, thermal compensation layer 130, condenser thermal compensation layer 230, evaporator thermal compensation layer 330, or combinations thereof) or to improve condensation of the heat transfer fluid 40 at the condenser plate 106 and/or condenser wick 116. The coating 160 may be hydrophobic coating or a hydrophilic coating. Examples of hydrophobic coatings may include, but are not limited to, alumina ($Al_2O_3$), silica ($SiO_2$), or other hydrophobic materials. In some embodiments, the coating 160 may be a super-hydrophobic coating. Examples of hydrophilic coatings may include, but are not limited to metals, hydrophilic polymer coatings, or other hydrophilic coatings. In some embodiments, the coating 160 may include a super-hydrophilic coating. In some embodiments, coating 160 may include TEFLON® coatings produced and sold by Chemours.

In some embodiments in which the heat transfer fluid 40 is water, the vapor chamber heat spreader 102 may include a hydrophobic coating applied to the condensing surface 120, condenser wick 124, condenser thermal compensation layer 230, or combinations thereof. The hydrophobic coating applied to the condensing surface 120, the condenser wick 124, and/or the condenser thermal compensation layer 230 may enable efficient condensation of the heat transfer fluid 40 and efficient return of the condensed heat transfer fluid 40 to the evaporator plate 104. In some embodiments in which the heat transfer fluid 40 is water, the vapor chamber heat spreader 102 may include a hydrophilic coating applied to the evaporating surface 114, evaporator wick 116, evaporator thermal compensation layer 330, or combinations thereof. The hydrophilic coating applied to the evaporating surface 114, the evaporator wick 116, and/or the evaporator thermal compensation layer 330 may enable efficient return of the heat transfer fluid to the hotspot.

The vapor chamber heat spreader 102 may be made by forming the various wicking structures (e.g., evaporator wick 116, condenser wick 124) and thermal compensation layers (e.g., thermal compensation layer 130, condenser thermal compensation layer 230, and/or evaporator thermal compensation layer 330) on the surfaces of the vapor chamber heat spreader 102 (e.g., the evaporating surface 114, the condensing surface 120, the inner surfaces 109 of the sidewalls 108, and the fin surfaces 128 of the fins 126). In some embodiments, one or more coatings 160, such as hydrophilic or hydrophobic coatings may be applied to one or more of the wicking structures, thermal compensation layers, or surfaces. Once the wicking structures and/or thermal compensation layers have been applied, the evaporator plate 104 and the condenser plate 106 may be bonded to the sidewalls 108, fins 126, or both to form the vapor chamber heat spreader 102. The evaporator plate 104 and condenser plate 106 may be bonded to the sidewalls 108 and/or the fins 126 by any suitable method, such as, but not limited to, transient liquid phase (TLP) bonding/sintering, solder bonding, brazing, diffusion bonding, electroplate bonding, electroless plate bonding, or other bonding process.

Referring again to FIG. 1, in some embodiments, the electronic device 20 may be a semiconductor device formed from a wide band gap semiconductor material suitable for the manufacture or production of power semiconductor devices such as power IGBTs and power transistors. Semiconductor devices may be formed from wide band gap semiconductor materials including without limitation, silicon carbide (SiC), gallium nitride (GaN), diamond, and the like. In some embodiments, vapor chamber heat spreader 102 and the electronic device 20 may include a coating, such as nickel (Ni) sputtered coating for example, to enable TLP sintering of the electronic device 20 to the vapor chamber heat spreader 102.

As depicted in FIG. 1, the vapor chamber heat spreader 102 may be bonded to a single electronic device 20. In some embodiments, a plurality of electronic devices 20 may be bonded to the vapor chamber heat spreader 102. In some embodiments, heat generating devices other than electronic devices 20 or semiconductor devices may be attached to the vapor chamber heat spreader 102. The electronic devices 20 may be power semiconductor devices such as insulated-gate bipolar transistors (IGBTs), power diodes, power metal-oxide-semiconductor field-effect transistors (MOSFETs), power transistors, and the like. In some embodiments, the semiconductor devices of one or more power electronics assemblies 100 may be electrically coupled to form an inverter circuit or system for vehicular applications, such as for hybrid vehicles or electric vehicles, for example.

The vapor chamber heat spreaders 102 and power electronics assemblies 100 described herein may be incorporated into an inverter circuit or system that converts direct current electrical power into alternating current electrical power and vice versa depending on the particular application. For example, in a hybrid electric vehicle application, several power electronics assemblies may be electrically coupled together to form a drive circuit that converts direct current electrical power provided by a bank of batteries into alternating electrical power that is used to drive an electric motor coupled to the wheels of a vehicle to propel the vehicle using electric power.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A vapor chamber heat spreader comprising:
   an evaporator plate;
   a condenser plate spaced apart from the evaporator plate;
   a plurality of sidewalls and a plurality of fins, each of the plurality of sidewalls and the plurality of fins extending between and coupled to the evaporator plate and to the condenser plate, the plurality of sidewalls and the plurality of fins cooperating to define a plurality of vapor chambers disposed between the evaporator plate and the condenser plate, wherein each of the plurality of vapor chambers is isolated from each of the other vapor chambers;
   a condenser wick coupled to a condensing surface of the condenser plate, the condenser wick comprising an MIO structure covering the entire condensing surface of the condenser plate; and
   a thermal compensation layer coupled to an inner surface of each of the plurality of sidewalls and the fin surfaces of each of the plurality of fins, the thermal compensation layer comprising a sidewall wick and a plurality of core-shell phase change (PC) particles at least partially embedded in the sidewall wick, wherein the sidewall wick comprises a metal inverse opal (MIO) structure and the core-shell PC particles comprise:
      a core comprising a phase change material (PCM) having a PC temperature within an operating temperature range of the vapor chamber heat spreader; and
      a shell encapsulating the core, the shell comprising a shell material having a melt temperature greater than the PC temperature of the PCM.

2. The vapor chamber heat spreader of claim 1, further comprising a heat transfer fluid disposed within the at least one vapor chamber, the heat transfer fluid having a vaporization temperature within an operating temperature range of the vapor chamber heat spreader.

3. The vapor chamber heat spreader of claim 1, wherein the PCM has a PC temperature of from 50° C. to 250° C.

4. The vapor chamber heat spreader of claim 1, further comprising an evaporator wick coupled to an evaporating surface of the evaporator plate, the evaporator wick comprising an MIO structure.

5. The vapor chamber heat spreader of claim 1, further comprising a condenser thermal compensation layer formed on a condensing surface of the condenser plate, the condenser thermal compensation layer comprising the condenser wick covering the entire condensing surface of the condenser plate and a plurality of condenser core-shell PC particles at least partially embedded in the condenser wick, wherein the plurality of condenser core-shell PC particles comprise:
   a core comprising a phase change material (PCM) having a PC temperature within an operating temperature range of the vapor chamber heat spreader; and
   a shell encapsulating the core, the shell comprising a shell material having a melt temperature greater than the PC temperature of the PCM.

6. The vapor chamber heat spreader of claim 5, further comprising an evaporator thermal compensation layer formed on an evaporating surface of the evaporator plate, the evaporator thermal compensation layer comprising an evaporator wick and a plurality of evaporator core-shell PC particles at least partially embedded in the evaporator wick, wherein the evaporator wick comprises an MIO layer and the plurality of evaporator core-shell PC particles comprise:
   a core comprising a phase change material (PCM) having a PC temperature within an operating temperature range of the vapor chamber heat spreader; and
   a shell encapsulating the core, the shell comprising a shell material having a melt temperature greater than the PC temperature of the PCM.

7. The vapor chamber heat spreader of claim 6, wherein the PC temperature of the evaporator core-shell PC particles is greater than the PC temperature of the condenser core-shell PC particles.

8. The vapor chamber heat spreader of claim 6, wherein the evaporator wick comprises a porosity different than the condenser wick, the sidewall wick, or both.

9. The vapor chamber heat spreader of claim 1, further comprising an evaporator thermal compensation layer formed on an evaporating surface of the evaporator plate, the evaporator thermal compensation layer comprising an evaporator wick and a plurality of evaporator core-shell PC particles at least partially embedded in the evaporator wick, wherein the evaporator wick comprises an MIO structure and the plurality of evaporator core-shell PC particles comprise:
   a core comprising a phase change material (PCM) having a PC temperature within an operating temperature range of the vapor chamber heat spreader; and
   a shell encapsulating the core, the shell comprising a shell material having a melt temperature greater than the PC temperature of the PCM.

10. A power electronics device comprising:
    the vapor chamber heat spreader of claim 1; and
    an electronics device in thermal communication with the evaporator plate of the vapor chamber heat spreader.

11. The vapor chamber heat spreader of claim 1, comprising a plurality of thermal compensation layers formed on each of the inner surfaces of the sidewalls and the fin surfaces of the fins, wherein:
    each thermal compensation layer comprises PCM particles having an average particle size or PCM different from the PCM particles of the other of the plurality of thermal compensation layers; and
    the differences between the PCM particles between the plurality of thermal compensation layers produces a graduated heat capacity that changes through the overall thickness of the plurality of thermal compensation layers.

12. The vapor chamber heat spreader of claim 1, further comprising a coating applied to a surface of the sidewall wick.

13. The vapor chamber heat spreader of claim 1, further comprising the condenser wick coupled to the condensing surface of the condenser plate and an evaporator wick coupled to an evaporating surface of the evaporator plate, the condenser wick and the evaporator wick each comprising an MIO structure, wherein:
the condenser wick comprises a hydrophobic coating applied to surfaces of the MIO structure; and
the evaporator wick comprises a hydrophilic coating applied to surfaces of the MIO structure.

14. A method of making a vapor chamber heat spreader, the method comprising:
forming a thermal compensation layer on an inner surface of one or more of a plurality of sidewalls, the thermal compensation layer comprising a sidewall wick and a plurality of core-shell phase change (PC) particles at least partially embedded in the sidewall wick, wherein the sidewall wick is a metal inverse opal (MIO) structure and the core-shell PC particles comprise:
a core comprising a phase change material (PCM) having a PC temperature within an operating temperature range of the vapor chamber heat spreader; and
a shell encapsulating the core, the shell comprising a shell material having a melt temperature greater than the PC temperature of the PCM;
forming a condenser wick on a condensing surface of a condenser plate, the condenser wick covering the entire condensing surface of the condenser plate; and
after forming the thermal compensation layer, coupling an evaporator plate and the condenser plate to the plurality of sidewalls to form the vapor chamber heat spreader having a vapor chamber defined by an evaporating surface of the evaporator plate, the inner surfaces of the plurality of sidewalls, and the condensing surface of the condenser plate.

15. The method of claim 14, wherein forming the thermal compensation layer comprises:
depositing a plurality of sacrificial opals and a plurality of the core-shell PC particles onto the inner surface of the sidewalls;
depositing a metal onto and between the plurality of sacrificial opals and the plurality of core-shell PC particles; and
removing the plurality of sacrificial opals through dissolving, etching, or thermally decomposing the sacrificial opals to form the MIO structure of the sidewall wick having the core-shell PC particles at least partially embedded therein.

16. The method of claim 14, further comprising forming an evaporator wick on the evaporating surface of the evaporator plate, wherein forming the evaporator wick, the condenser wick, or both comprises:
depositing a plurality of sacrificial opals onto the evaporating surface, the condensing surface, or both;
depositing a metal onto and between the plurality of sacrificial opals; and
removing the plurality of sacrificial opals to form the evaporator wick, the condenser wick, or both.

17. The method of claim 14, further comprising forming a condenser thermal compensation layer on the condensing surface of the condenser plate, the condenser thermal compensation layer including a condenser wick and a plurality of condenser core-shell PC particles at least partially embedded within the condenser wick, wherein forming the condenser thermal compensation layer comprises:
depositing a plurality of sacrificial opals and the plurality of condenser core-shell PC particles on the condensing surface of the condenser plate;
electroplating or electroless plating a metal over the plurality of sacrificial opals and the plurality of condenser core-shell PC particles; and
removing the plurality of sacrificial opals through dissolving, etching, or thermally decomposing the sacrificial opals to form an MIO structure of the condenser wick having the condenser core-shell PC particles at least partially embedded therein.

18. The method of claim 17, further comprising forming an evaporator thermal compensation layer on the evaporating surface of the evaporator plate, the evaporator thermal compensation layer including an evaporator wick and a plurality of evaporator core-shell PC particles at least partially embedded within the evaporator wick, wherein forming the evaporator thermal compensation layer comprises:
depositing a plurality of sacrificial opals and the plurality of evaporator core-shell PC particles on the evaporating surface of the evaporator plate;
electroplating or electroless plating a metal over the plurality of sacrificial opals and the plurality of evaporator core-shell PC particles; and
removing the plurality of sacrificial opals through dissolving, etching, or thermally decomposing the sacrificial opals to form an MIO structure of the evaporator wick having the evaporator core-shell PC particles at least partially embedded therein;
wherein the PCM of the evaporator core-shell PC particles has a PC temperature greater than a PC temperature of the PCM of the condenser core-shell PC particles.

19. The method of claim 14, further comprising applying an etchant to the thermal compensation layer, wherein the etchant increases a porosity of the MIO structure of the sidewall wick.

20. The method of claim 14, wherein forming the condenser wick comprises:
depositing a plurality of sacrificial opals onto the condensing surface;
depositing a metal onto and between the plurality of sacrificial opals; and
removing the plurality of sacrificial opals to form the condenser wick.

* * * * *

UNITED STATES PATENT AND TRADEMARK OFFICE
CERTIFICATE OF CORRECTION

| | |
|---|---|
| PATENT NO. | : 10,948,241 B2 |
| APPLICATION NO. | : 16/170974 |
| DATED | : March 16, 2021 |
| INVENTOR(S) | : Shailesh N. Joshi |

Page 1 of 1

It is certified that error appears in the above-identified patent and that said Letters Patent is hereby corrected as shown below:

On the Title Page

In Column 2, Under Other Publications Line 1 cite no. 1, delete "Conductioin" and insert --Conduction--, therefor.

In the Specification

In Column 6, Line(s) 16, delete "(am))" and insert --(μm))--, therefor.

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*